United States Patent
Coston

(10) Patent No.: US 8,164,739 B2
(45) Date of Patent: Apr. 24, 2012

(54) CONTROLLING FLUCTUATIONS IN POINTING, POSITIONING, SIZE OR DIVERGENCE ERRORS OF A BEAM OF LIGHT FOR OPTICAL APPARATUS

(75) Inventor: Scott D. Coston, New Milford, CT (US)

(73) Assignee: ASML Holding N.V., Veldhoven (NL)

( * ) Notice: Subject to any disclaimer, the term of this patent is extended or adjusted under 35 U.S.C. 154(b) by 798 days.

(21) Appl. No.: 12/239,165

(22) Filed: Sep. 26, 2008

(65) Prior Publication Data

US 2009/0086184 A1   Apr. 2, 2009

Related U.S. Application Data

(60) Provisional application No. 60/976,126, filed on Sep. 28, 2007.

(51) Int. Cl.
*G03B 27/54* (2006.01)
*G03B 27/42* (2006.01)

(52) U.S. Cl. .................................. 355/67; 355/53

(58) Field of Classification Search ................ 355/53, 355/67
See application file for complete search history.

(56) References Cited

U.S. PATENT DOCUMENTS

| | | | |
|---|---|---|---|
| 5,627,670 A * | 5/1997 | Minoura et al. | 359/196.1 |
| 5,684,566 A | 11/1997 | Stanton | |
| 6,577,380 B1 * | 6/2003 | Sposili et al. | 355/67 |
| 6,672,739 B1 * | 1/2004 | Argyle et al. | 362/259 |
| 6,822,728 B2 * | 11/2004 | McCullough et al. | 355/53 |
| 6,894,765 B2 * | 5/2005 | Mackey et al. | 355/69 |
| 6,927,836 B2 * | 8/2005 | Nishinaga | 355/53 |
| 7,327,916 B2 | 2/2008 | Tanaka | |
| 7,418,172 B2 * | 8/2008 | Tanaka et al. | 385/39 |
| 2005/0079645 A1 * | 4/2005 | Moriwaka | 438/29 |
| 2007/0127005 A1 * | 6/2007 | Visser et al. | 355/71 |

FOREIGN PATENT DOCUMENTS

| | | |
|---|---|---|
| JP | 09-006011 A | 1/1997 |
| JP | 2004-297058 A | 10/2004 |
| WO | WO 2006/079486 A2 * | 8/2006 |
| WO | WO 2007/053335 A3 | 5/2007 |

OTHER PUBLICATIONS

English language Abstract of Japanese Patent Publication No. 09-006011 A, the Japanese Patent Office, published Jan. 10, 1997; 1 page. English language Abstract of Japanese Patent Publication No. 2004-297058 A, the Japanese Patent Office, published Oct. 21, 2004; 1 page.
English translation of Japanese Notification of Reasons for Refusal, directed to related Japanese Patent Application No. 2008-250029, the Japanese Patent Office, mailed Jun. 14, 2011; 6 pages.

* cited by examiner

*Primary Examiner* — Edward Glick
*Assistant Examiner* — Deoram Persaud
(74) *Attorney, Agent, or Firm* — Sterne, Kessler, Goldstein & Fox P.L.L.C.

(57) ABSTRACT

A system and method are used for controlling fluctuations in one or more of a beam pointing error, a beam positioning error, a beam size error or a beam divergence error of a beam of light in a lithography system. An optical apparatus may comprise a first beam control module having a first optics in an optical axis for optically isolating a laser pulse from a light source associated with an illuminator to provide the beam of light. These beam related errors may be selectively stabilized by either homogenizing selectively the spatial field and/or angular information of a given illumination profile for the beam of light and symmetrizing other one of the spatial field or angular information which is not being homogenized based on a first arrangement of the first optics or homogenizing and symmetrizing both of the spatial field and angular information based on a second arrangement of the first optics.

20 Claims, 15 Drawing Sheets

Figure 1:
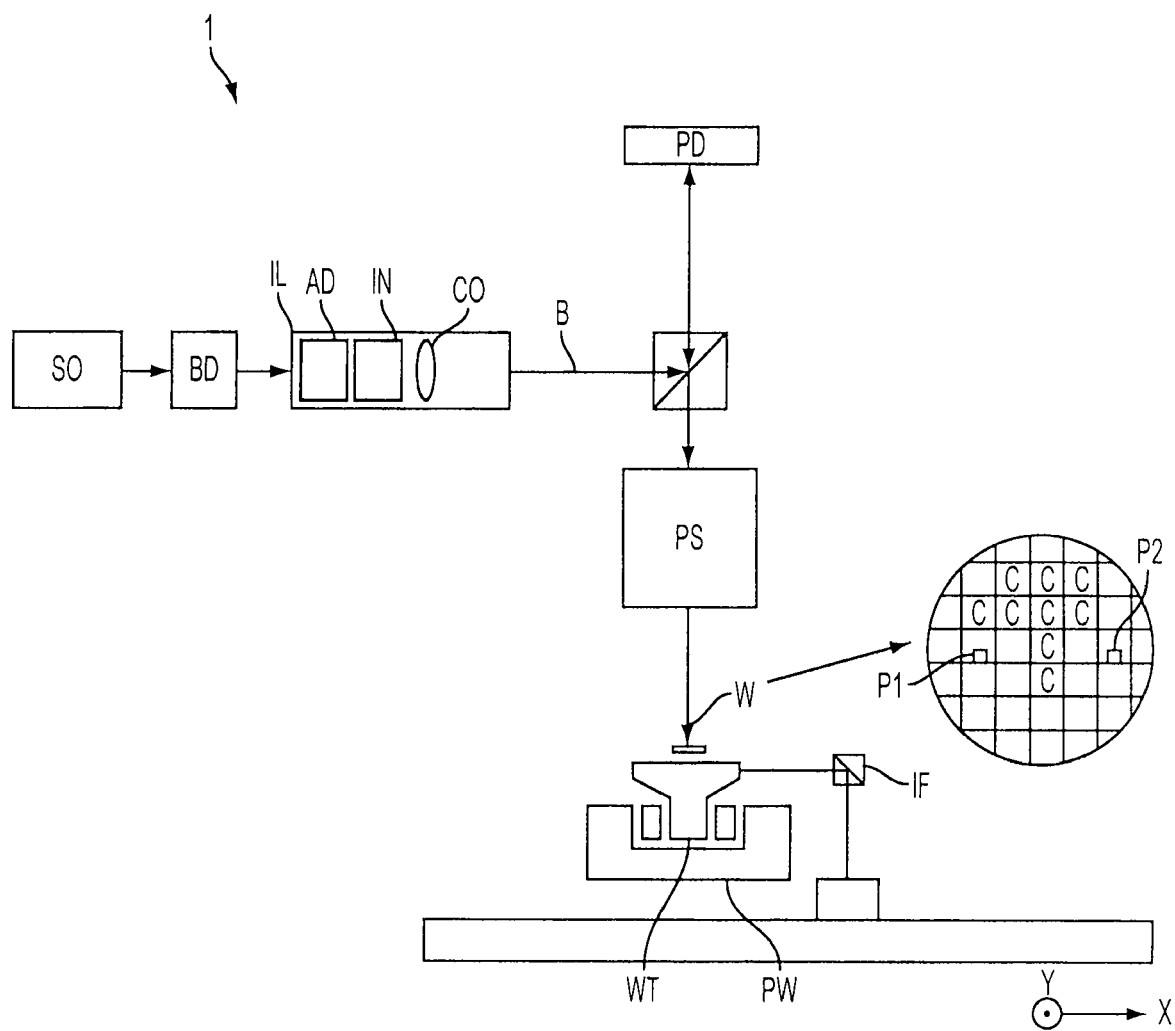

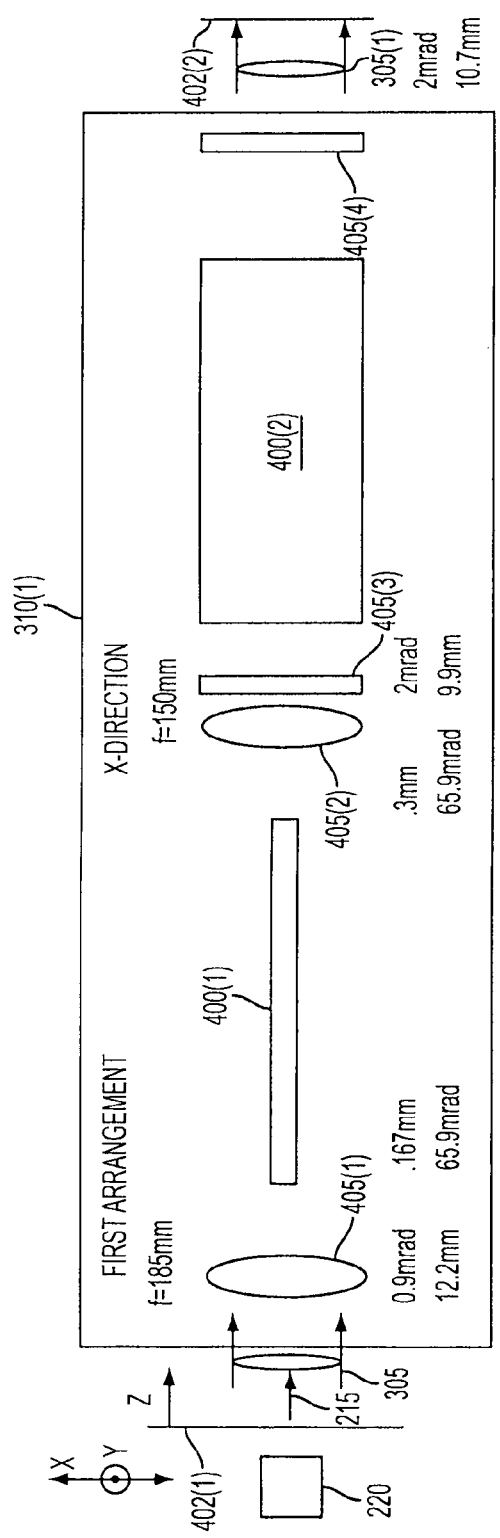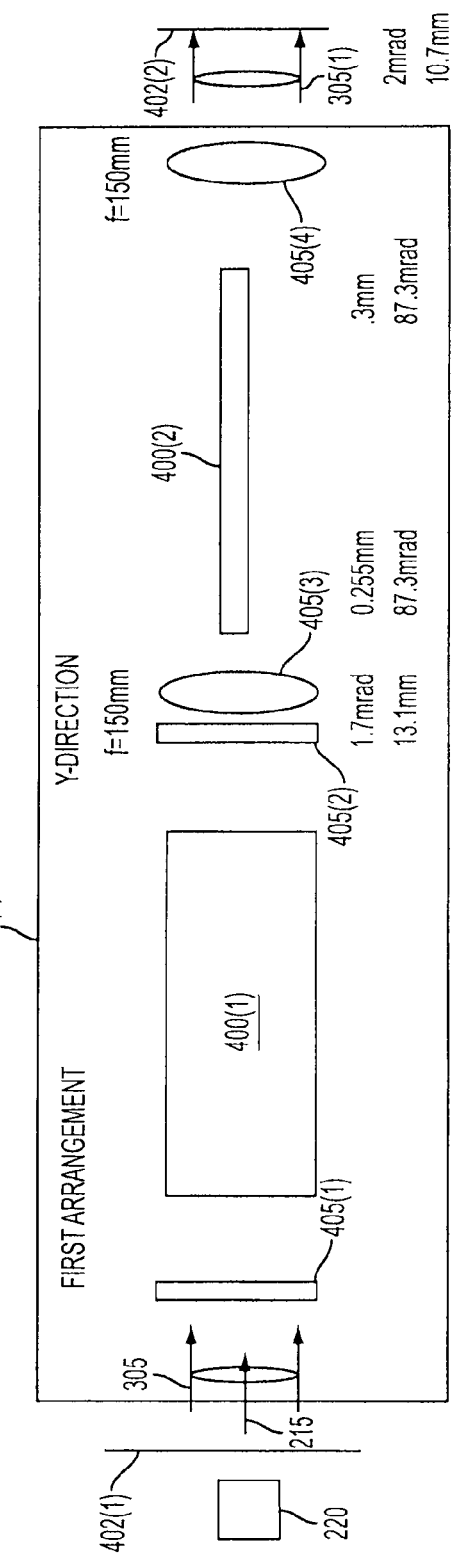
FIG. 4A
SIDE VIEW
FIG. 4B
TOP VIEW

SIDE VIEW

TOP VIEW

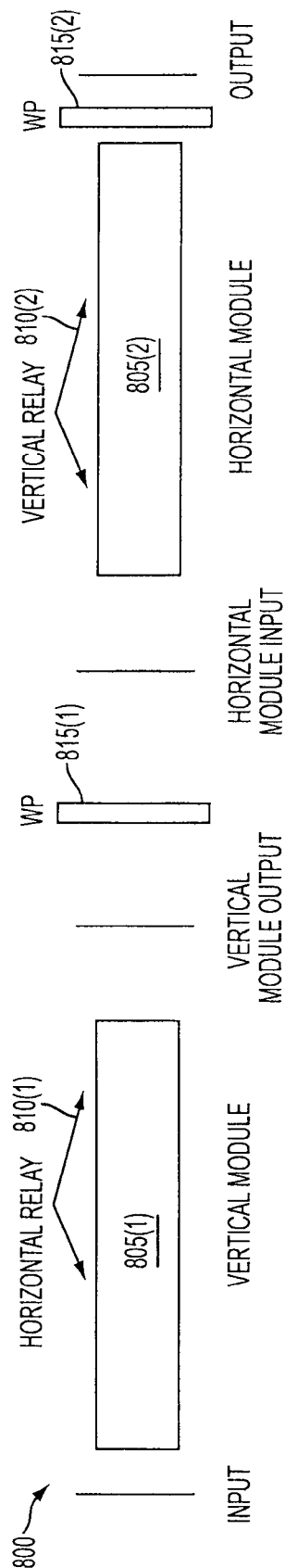

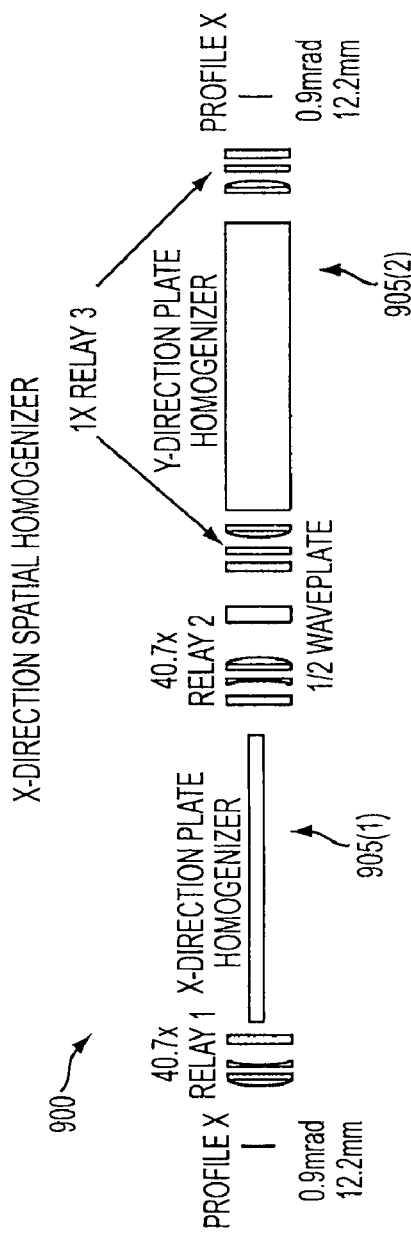
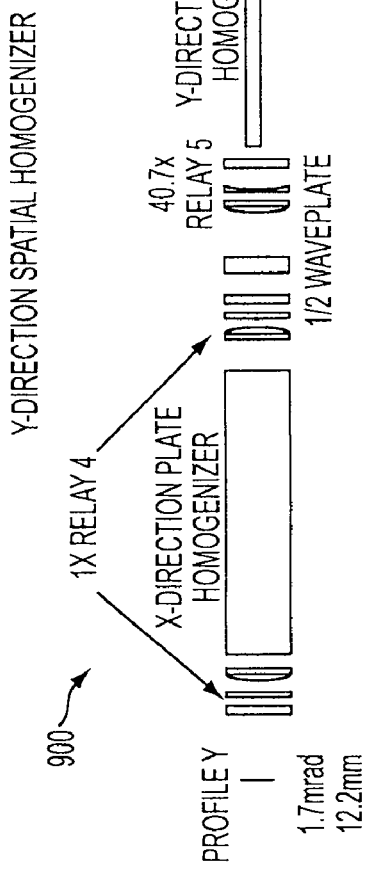
FIG. 9A
FIG. 9B

CONTROLLING FLUCTUATIONS IN POINTING, POSITIONING, SIZE OR DIVERGENCE ERRORS OF A BEAM OF LIGHT FOR OPTICAL APPARATUS

CROSS REFERENCE TO RELATED APPLICATIONS

This application claims benefit to U.S. Provisional Patent Application No. 60/976,126, filed Sep. 28, 2007, which is incorporated by reference herein in its entirety.

BACKGROUND

1. Field of the Invention

The present invention relates to an optical apparatus, suitable for use as part of a lithographic apparatus.

2. Related Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which can be referred to as a mask or a reticle, can be used to generate a circuit pattern corresponding to an individual layer of a flat panel display (or other device). This pattern can be transferred onto all or part of the substrate (e.g., a glass plate), by imaging onto a layer of radiation-sensitive material (resist) provided on the substrate.

Instead of a circuit pattern, the patterning means can be used to generate other patterns, for example a color filter pattern or a matrix of dots. Instead of a mask, the patterning device can comprise a patterning array that comprises an array of individually controllable elements. The pattern can be changed more quickly and for less cost in such a system compared to a mask-based system.

Photolithography (also called microlithography) is used for manufacturing of semiconductor devices. Photolithography uses electromagnetic radiation, such as ultraviolet (UV), deep UV or visible light to generate fine patterns in a semiconductor device design. Many types of semiconductor devices, such as diodes, transistors, and integrated circuits, can be fabricated using photolithographic techniques. Exposure systems or tools are used to implement photolithographic techniques, such as etching, in semiconductor fabrication. An exposure system typically includes an illumination system, a reticle (also called a mask) containing a circuit pattern, a projection system, and a wafer alignment stage for aligning a photosensitive resist-covered semiconductor wafer. The illumination system illuminates a region of the reticle with a preferably rectangular slot illumination field. The projection system projects an image of the illuminated region of the reticle circuit pattern onto the wafer.

Instead of a mask, in some lithographic apparatus, the patterning device can be a patterning array that comprises an array of individually controllable elements. Sometimes, the pattern can be changed more efficiently in a maskless system compared to a mask-based system. These types of apparatus are referred to as Optical Maskless Lithographic (OML) apparatus.

Known lithographic apparatus include so-called steppers or step-and-repeat apparatus, and so-called scanners or step-and-scan apparatus. In a stepper each target portion is irradiated by exposing an entire pattern onto the target portion at one time, and the wafer is moved by a predetermined amount to a next position for a subsequent exposure. In a scanner, each target portion is irradiated by scanning the pattern through a radiation beam in a given direction (the "scanning"-direction) while synchronously scanning the substrate parallel or anti-parallel to this direction, and next the wafer is moved to a next position for a subsequent exposure.

Some illumination systems include an array or diffractive scattering optical element positioned before the reticle. The scattering optical element produces a desired angular light distribution that is subsequently imaged or relayed to the reticle.

Some conventional optical systems including lithographic systems use illuminators that include Excimer lasers as a light source and rely on every point of a wafer seeing multiple pulses (~30) to average out effects from laser pulse to pulse fluctuations in pointing and divergence. However, one type of such system is an Optical Maskless Lithography (OML) system that may be a single pulse printing tool. Therefore, there is no pulse to pulse averaging to reduce laser fluctuation effects. In addition, a relatively high OML Projection Optics magnification may make control of laser pointing and divergence fluctuation tighter by ~10× over many conventional optical or lithographic tools. Absent a way within the laser to control pulse to pulse fluctuation in an OML system, it is difficult to control pulse to pulse beam pointing and divergence to various degrees. However, pointing or divergence change manifests itself as an asymmetric or changing pupil.

SUMMARY

What is needed is an optical apparatus for substantially controlling fluctuations in one or more of a beam pointing error, a beam positioning error, a beam size error or a beam divergence error of a beam of light.

In one embodiment of the present invention, there is provided an optical apparatus comprising a first beam control module having a first optics for controlling fluctuations in one or more of a beam pointing error, a beam positioning error, a beam size error or a beam divergence error of a beam of light in a lithography system. The optical apparatus may comprise the first beam control module in an optical axis for optically isolating a laser pulse from a light source associated with an illuminator to provide the beam of light. The first beam control module may selectively stabilize at least one of the beam pointing error, beam positioning error, beam size error or beam divergence error by at least one of homogenizing selectively at least one of the spatial field or angular information of a given illumination profile for the beam of light and symmetrizing other one of the at least one of the spatial field or angular information, which is not being homogenized, based on a first arrangement of the first optics, or homogenizing and symmetrizing both of the at least one of spatial field and angular information based on a second arrangement of the first optics.

According to another embodiment of the present invention there is provided a lithographic apparatus comprising an illumination system, an array of individually controllable elements, and a projection system. The illumination system conditions a beam of light and comprises a beam symmetry shaper with inverting optics coupled to a beam control module having first and second homogenizer plates. The array of individually controllable elements modulate the beam of light. The projection system projects the modulated beam of the light onto a target portion of a substrate.

According to a further embodiment of the present invention, there is provided a method for controlling a beam of light from a light source associated with an illuminator in a lithography system. The method comprises providing a first beam control module having first optics in an optical axis for optically isolating a laser pulse from the light source, which provides the beam of light to selectively stabilize at least one of the beam pointing error, beam positioning error, beam size error or beam divergence error. The method further comprises using at least one of a first arrangement of the first optics to homogenize selectively at least one of spatial field or angular information of a given illumination profile for the beam of light and symmetrize another one of the at least one of the spatial field or angular information, which is not being homogenized, based on the first arrangement of the first optics or a second arrangement of the first optics to homogenize and symmetrize both of the at least one of spatial field and angular information based on the second arrangement of the first optics.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

Figure 2:
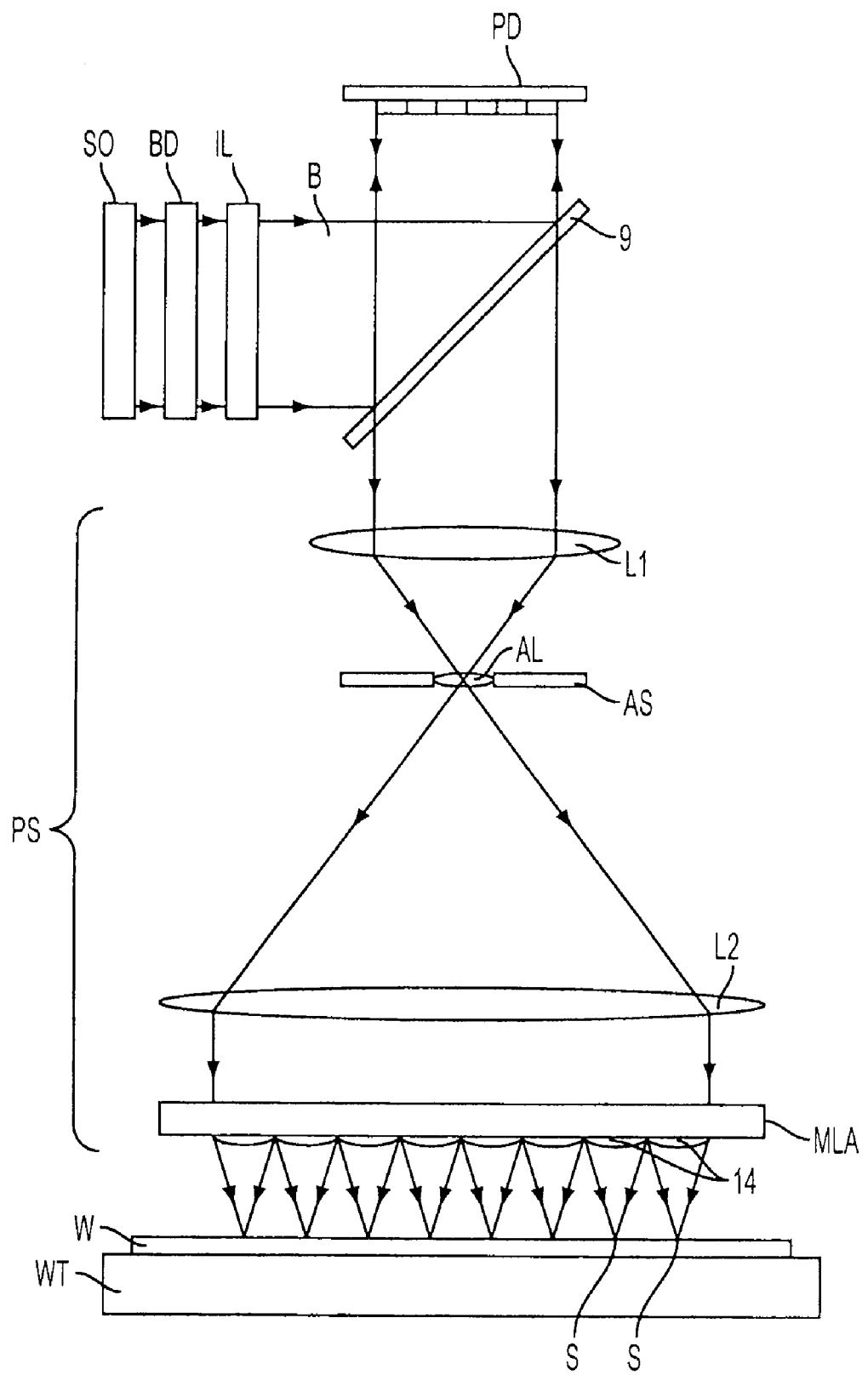

FIGS. 1 and 2 schematically depict maskless lithographic apparatus or system, according to various embodiments of the present invention.

Figure 3:
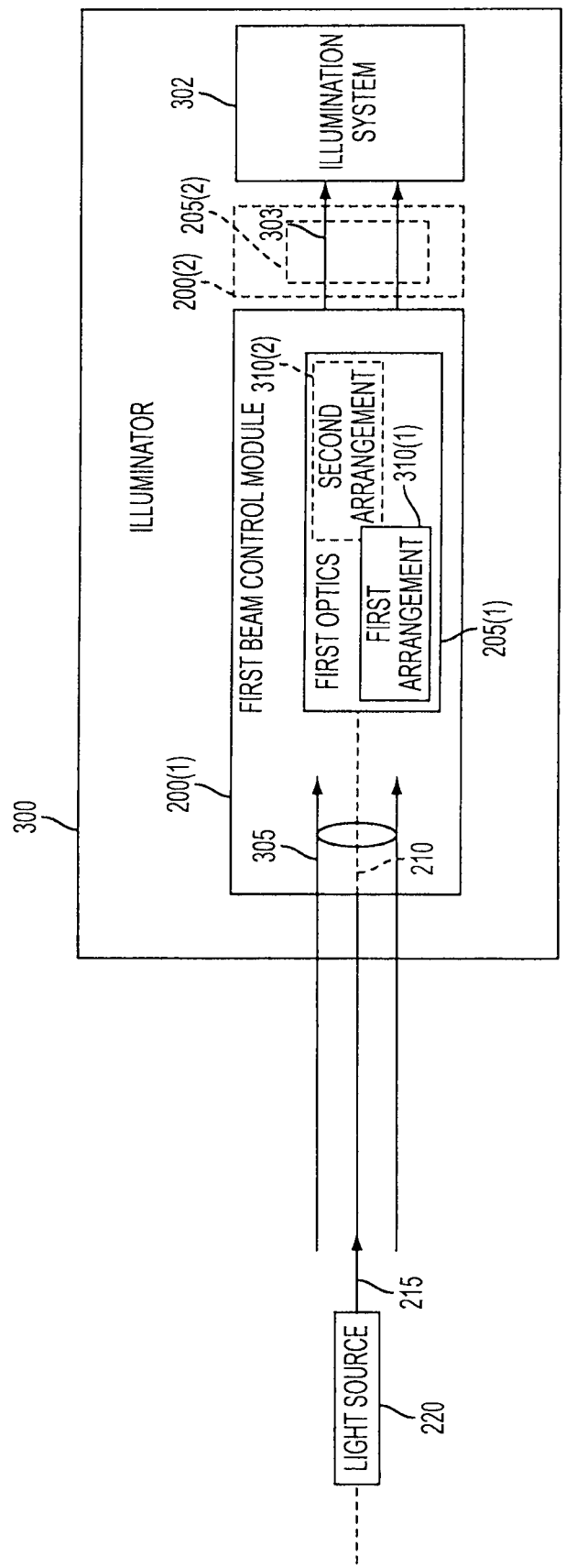

FIG. 3 schematically depicts an optical apparatus comprising a first beam control module having a first optics in an optical axis for optically isolating a laser pulse from a light source associated with an illuminator according to an embodiment of the invention as shown in FIG. 2.

FIGS. 4A and 4B schematically depict a first arrangement of the first optics shown in FIG. 3, according to one exemplary embodiment of the present invention.

Figure 5:
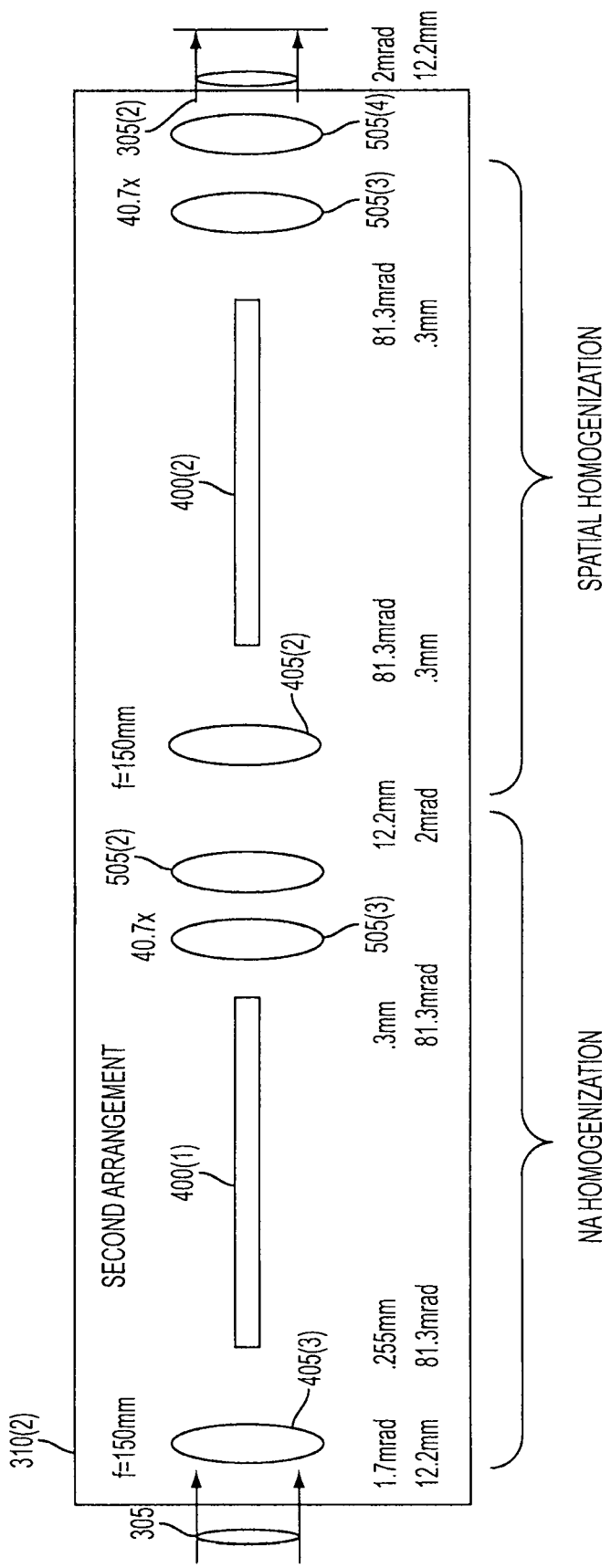

FIG. 5 schematically depicts a second arrangement of the first optics shown in FIG. 3, according to one illustrative embodiment of the present invention.

Figure 6:
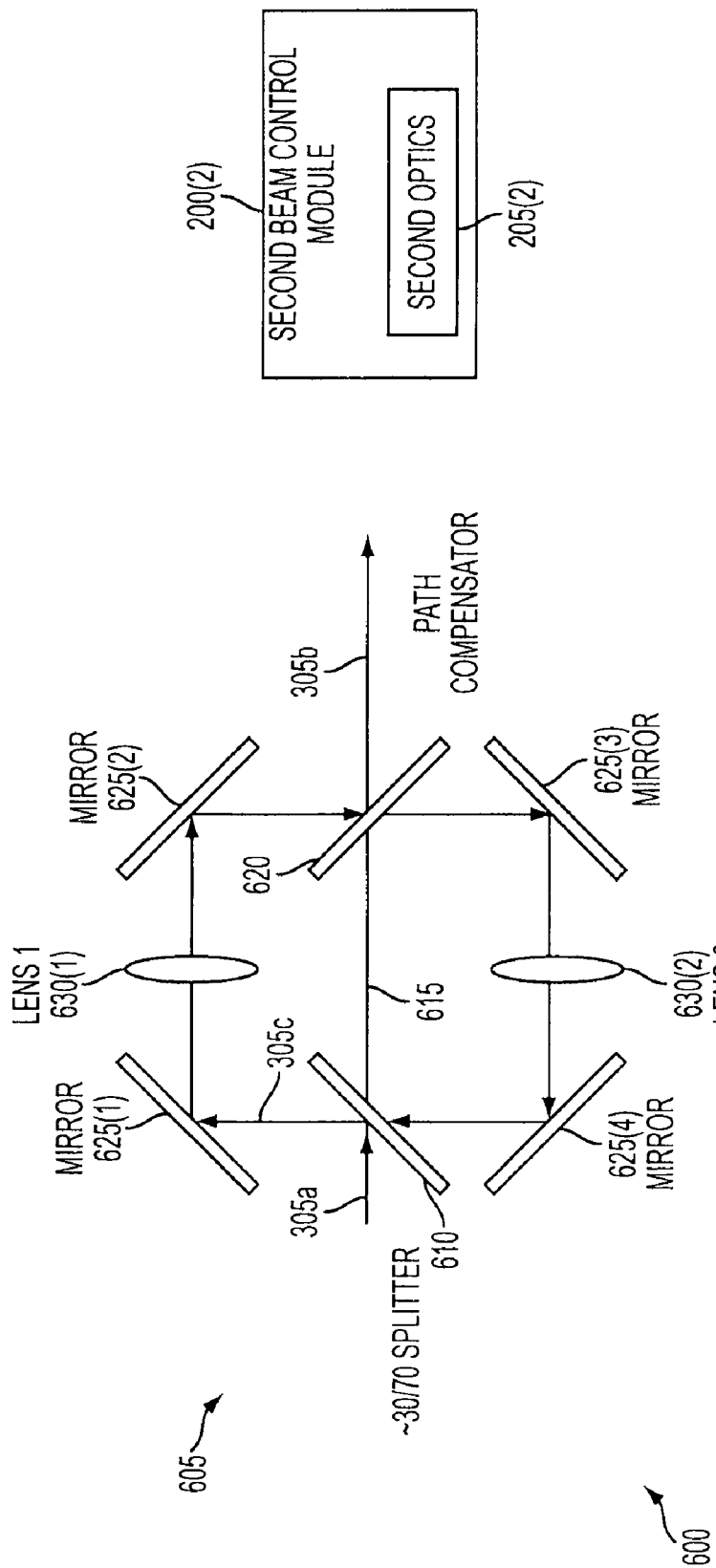

FIG. 6 schematically depicts an optical apparatus comprising the first beam control module shown in FIG. 3 and a second beam control module having a second optics coupled to the first beam control module in the optical axis to receive the beam of light, according to one illustrative embodiment of the present invention.

Figure 7A:
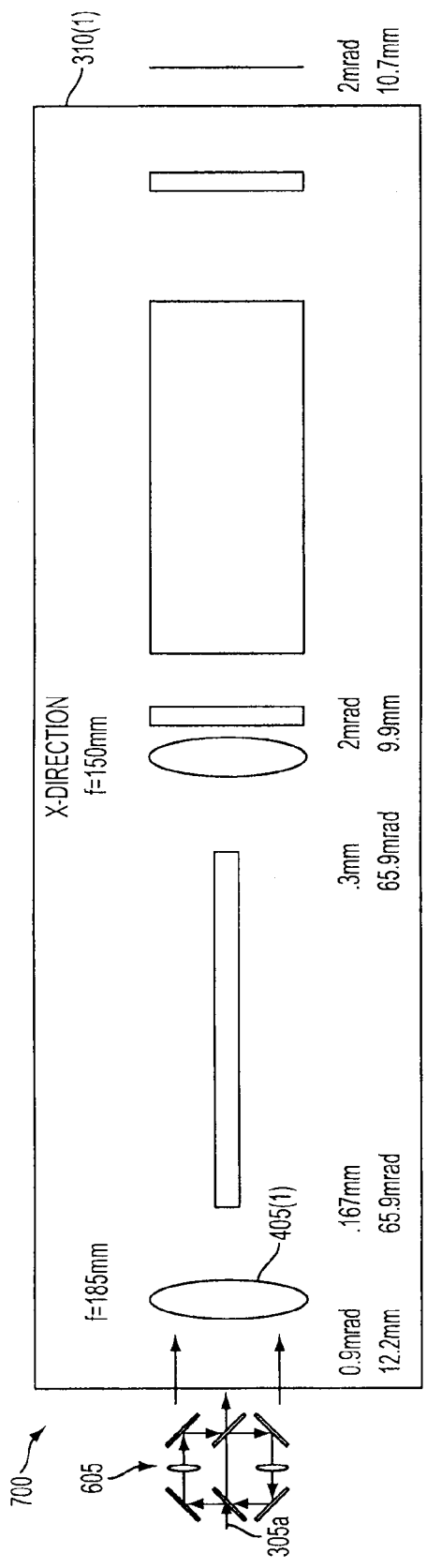
Figure 7B:
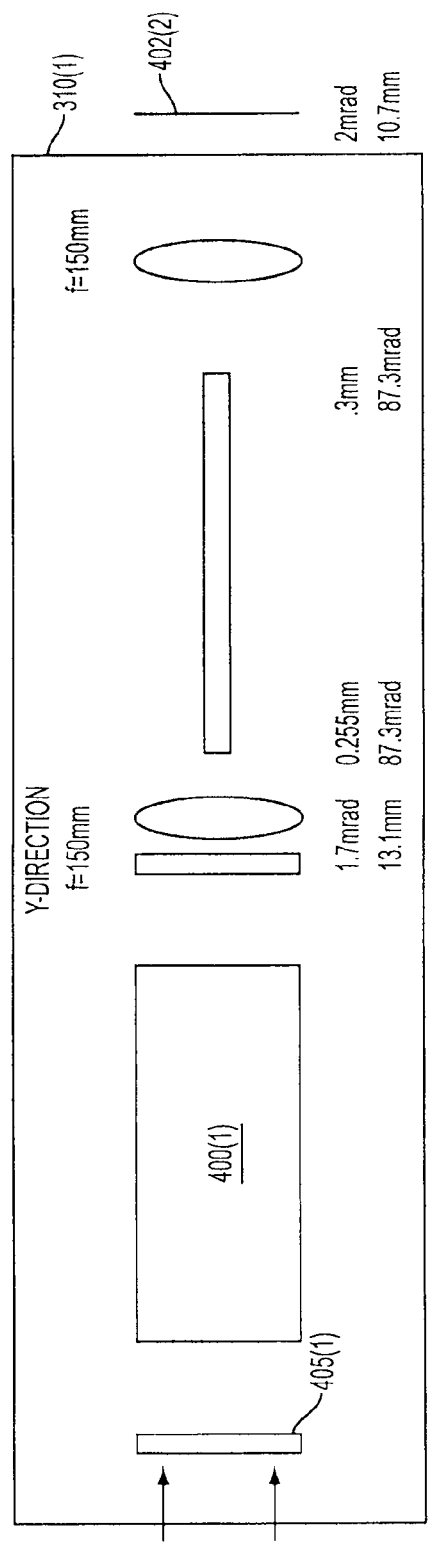

FIGS. 7A and 7B schematically depict a beam symmetry shaper with inverting optics for the second optics of the second beam control module to symmetrize spatial field and angular information of a given illumination profile for the beam of light and a first and a second homogenizer plates coupled to the beam symmetry shaper for the first arrangement of the first optics of the first beam control module, according to one illustrative embodiment of the present invention.

FIG. 7C schematically depicts an integrated beam control module that combines a vertical module with a horizontal module for controlling beam size, divergence, pointing and positioning errors, according to one embodiment of the present invention.

Figure 8A:
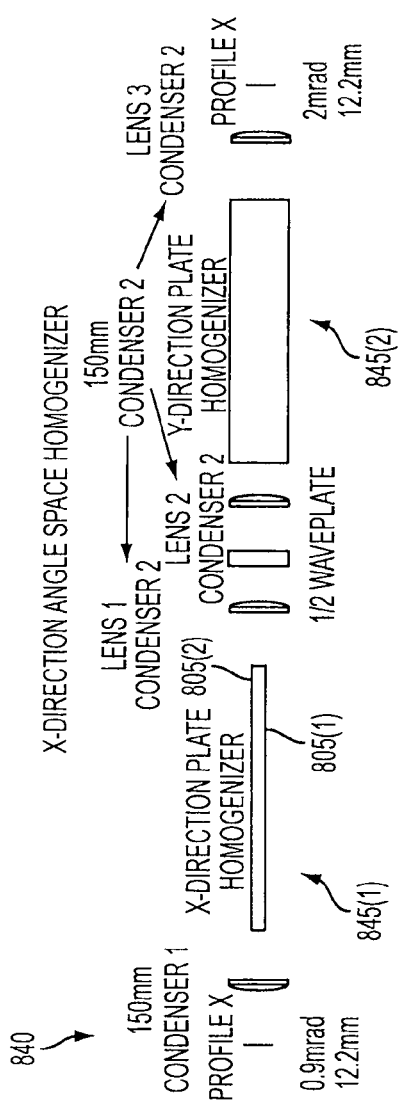

FIG. 8A schematically depicts an optical apparatus including a x-direction angle space homogenizer for angular homogenization and/or spatial symmetry, according to one illustrative embodiment of the present invention.

Figure 8B:
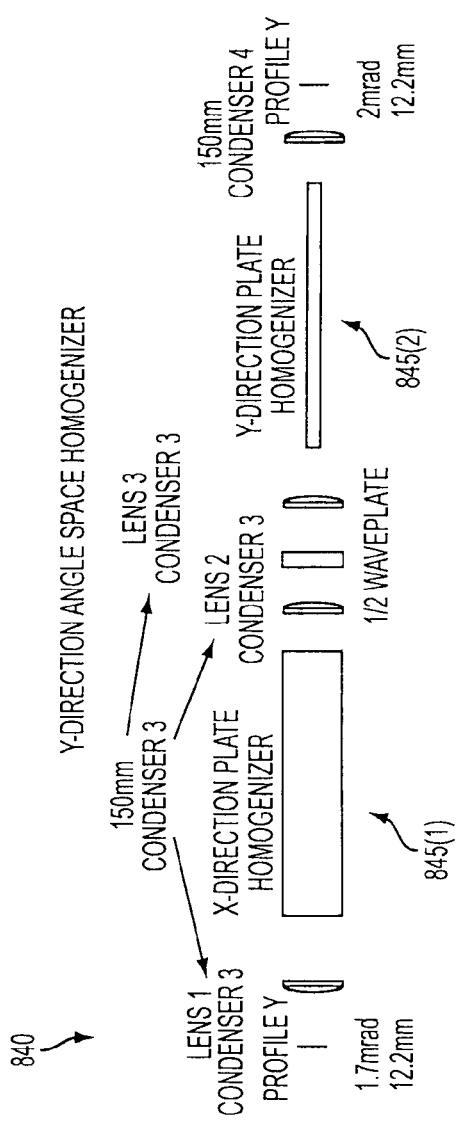

FIG. 8B schematically depicts an optical apparatus including a y-direction angle space homogenizer for angular homogenization and/or spatial symmetry, according to one illustrative embodiment of the present invention.

FIG. 9A schematically depicts an optical apparatus including a x-direction spatial homogenizer for spatial homogenization and/or angle symmetry, according to one illustrative embodiment of the present invention.

FIG. 9B schematically depicts an optical apparatus including a y-direction spatial homogenizer for spatial homogenization and/or angle symmetry, according to one illustrative embodiment of the present invention.

Figures 10A, 10B:
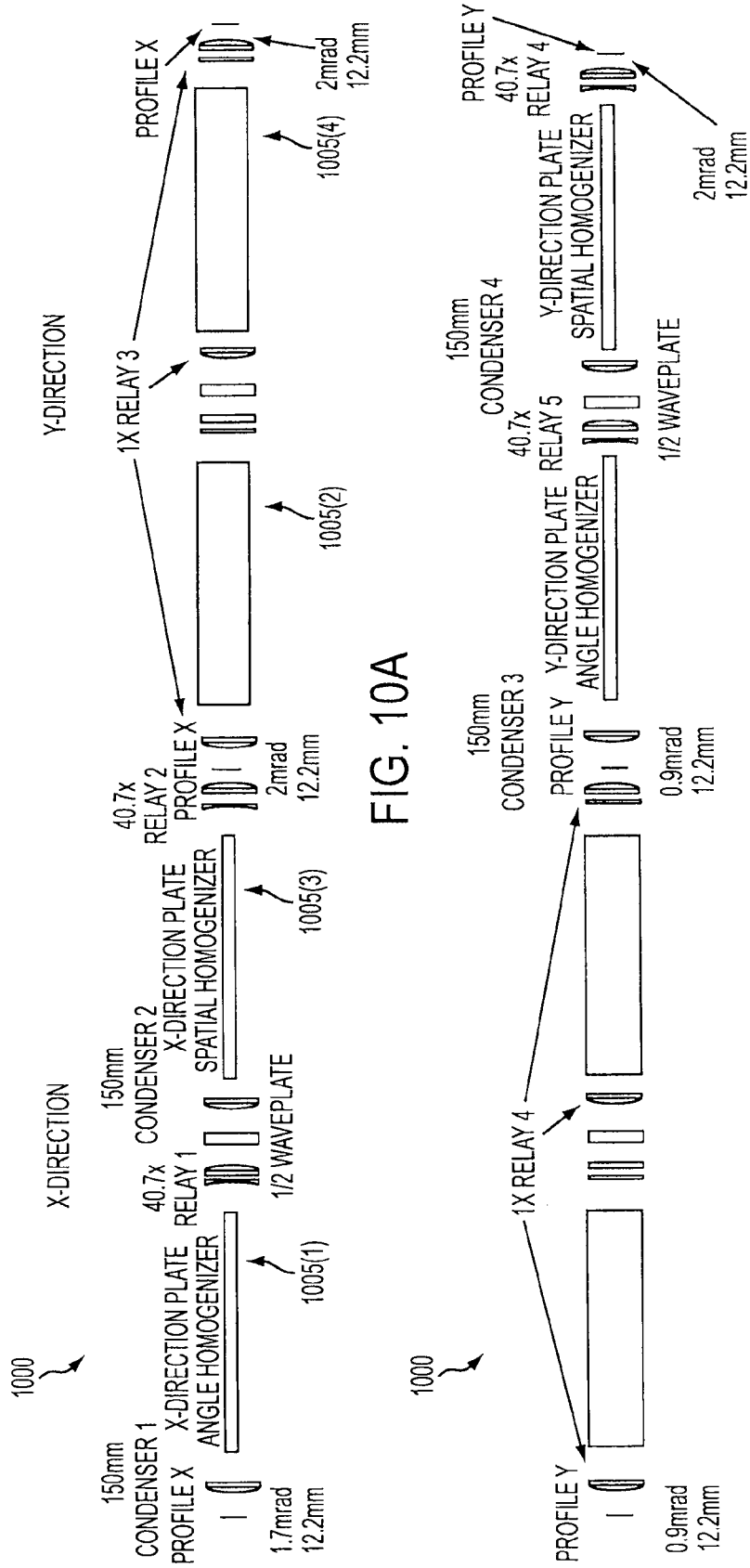

FIG. 10A schematically depicts a top view of an optical apparatus including a x-direction and y-direction angular/spatial homogenizer, according to one illustrative embodiment of the present invention.

FIG. 10B schematically depicts a side view of an optical apparatus including a x-direction and y-direction angular/spatial homogenizer, according to one illustrative embodiment of the present invention.

FIGS. 11A-11B and 12A-12B schematically show respective exemplary input and output images at a detector for the spatial field and pupil from an optics arrangement, according to one illustrative embodiment of the present invention.

FIGS. 13A-13B and 14A-14B schematically show respective exemplary input and output images at a detector for the spatial field and pupil from an optics arrangement, according to one illustrative embodiment of the present invention.

The present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

This specification discloses one or more embodiments that incorporate the features of the present invention involving control of fluctuations in one or more of a beam pointing error, a beam positioning error, a beam size error or a beam divergence error of a beam of light. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described can include a particular feature, structure, or characteristic, but every embodiment cannot necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention can be implemented in hardware, firmware, software, or any combination thereof. Embodiments of the invention can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

FIG. 1 schematically depicts the lithographic apparatus of one embodiment of the invention. The apparatus comprises an illumination system IL, a patterning device PD, a substrate table WT, and a projection system PS. The illumination system (illuminator) IL is configured to condition a radiation beam B (e.g., UV radiation).

The patterning device PD (e.g., a reticle or mask or an array of individually controllable elements) modulates the beam. In general, the position of the array of individually controllable elements will be fixed relative to the projection system PS. However, it can instead be connected to a positioner configured to accurately position the array of individually controllable elements in accordance with certain parameters.

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W.

The illumination system can include various types of optical components, such as refractive, reflective, magnetic, electromagnetic, electrostatic or other types of optical components, or any combination thereof, for directing, shaping, or controlling radiation.

The term "patterning device" or "contrast device" used herein should be broadly interpreted as referring to any device that can be used to modulate the cross-section of a radiation beam, such as to create a pattern in a target portion of the substrate. The devices can be either static patterning devices (e.g., masks or reticles) or dynamic (e.g., arrays of programmable elements) patterning devices. For brevity, most of the description will be in terms of a dynamic patterning device, however it is to be appreciated that a static pattern device can also be used without departing from the scope of the present invention.

It should be noted that the pattern imparted to the radiation beam can not exactly correspond to the desired pattern in the target portion of the substrate, for example if the pattern includes phase-shifting features or so called assist features. Similarly, the pattern eventually generated on the substrate can not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include, e.g., reticles, programmable mirror arrays, laser diode arrays, light emitting diode arrays, grating light valves, and LCD arrays.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." In one example, the patterning device comprises at least 10 programmable elements, e.g., at least 100, at least 1000, at least 10000, at least 100000, at least 1000000, or at least 10000000 programmable elements.

A programmable mirror array can comprise a matrix-addressable surface having a viscoelastic control layer and a reflective surface. The basic principle behind such an apparatus is that, e.g., addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electromechanical system devices) can also be used in a corresponding manner. In one example, a diffractive optical MEMS device is comprised of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction to unaddressed mirrors; in this manner, the reflected beam can be patterned according to the addressing pattern of the matrix-addressable mirrors. The required matrix addressing can be performed using suitable electronic means.

Another example PD is a programmable LCD array.

The lithographic apparatus can comprise one or more contrast devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In an example, such as the embodiment depicted in FIG. 1, the substrate W has a substantially circular shape, optionally with a notch and/or a flattened edge along part of its perimeter. In an example, the substrate has a polygonal shape, e.g., a rectangular shape.

In example where the substrate has a substantially circular shape include examples where the substrate has a diameter of at least 25 mm, for instance at least 50 mm, at least 75 mm, at least 100 mm, at least 125 mm, at least 150 mm, at least 175 mm, at least 200 mm, at least 250 mm, or at least 300 mm. In an embodiment, the substrate has a diameter of at most 500 mm, at most 400 mm, at most 350 mm, at most 300 mm, at most 250 mm, at most 200 mm, at most 150 mm, at most 100 mm, or at most 75 mm.

In examples where the substrate is polygonal, e.g., rectangular, include examples where at least one side, e.g., at least 2 sides or at least 3 sides, of the substrate has a length of at least 5 cm, e.g., at least 25 cm, at least 50 cm, at least 100 cm, at least 150 cm, at least 200 cm, or at least 250 cm.

In one example, at least one side of the substrate has a length of at most 1000 cm, e.g., at most 750 cm, at most 500 cm, at most 350 cm, at most 250 cm, at most 150 cm, or at most 75 cm.

In one example, the substrate W is a wafer, for instance a semiconductor wafer. In one example, the wafer material is selected from the group consisting of Si, SiGe, SiGeC, SiC, Ge, GaAs, InP, and InAs. In one example, the wafer is a III/V compound semiconductor wafer. In one example, the wafer is a silicon wafer. In an embodiment, the substrate is a ceramic substrate. In one example, the substrate is a glass substrate. In one example, the substrate is a plastic substrate. In one example, the substrate is transparent (for the naked human eye). In one example, the substrate is colored. In one example, the substrate is absent a color.

The thickness of the substrate can vary and, to an extent, can depend, e.g., on the substrate material and/or the substrate dimensions. In one example, the thickness is at least 50 cm, e.g., at least 100 μm, at least 200 μm, at least 300 μm, at least 400 μm, at least 500 μm, or at least 600 μm. In one example, the thickness of the substrate is at most 5000 μm, e.g., at most 3500 μm, at most 2500 μm, at most 1750 μm, at most 1250 μm, at most 1000 μm, at most 800 μm, at most 600 μm, at most 500 μm, at most 400 μm, or at most 300 μm.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements such as a micro lens array (known as an MLA) or a Fresnel lens array, e.g., to form the secondary sources and to image spots onto the substrate. In one example, the array of focusing elements (e.g., MLA) comprises at least 10 focus elements, e.g., at least 100 focus elements, at least 1000 focus elements, at least 10000 focus elements, at least 100000 focus elements, or at least 1000000 focus elements. In one example, the number of individually controllable elements in the patterning device is equal to or greater than the number of focusing elements in the array of focusing elements. In one example, one or more (e.g., 1000 or more, the majority, or about each) of the focusing elements in the array of focusing elements can be optically associated with one or more of the individually controllable elements in the array of individually controllable elements, e.g., with 2 or more of the individually controllable elements in the array of individually controllable elements, such as 3 or more, 5 or more, 10 or more, 20 or more, 25 or more, 35 or more, or 50 or more. In one example, the MLA is movable (e.g., with the use of actuators) at least in the direction to and away from the substrate, e.g., with the use of one or more actuators. Being able to move the MLA to and away from the substrate allows, e.g., for focus adjustment without having to move the substrate.

As herein depicted in FIGS. 1 and 2, the apparatus is of a reflective type (e.g., employing a reflective array of individually controllable elements). Alternatively, the apparatus can be of a transmissive type (e.g., employing a transmissive array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. In one example, the radiation source provides radiation having a wavelength of at least 5 nm, e.g., at least 10 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. In one example, the radiation provided by radiation source SO has a wavelength of at most 450 nm, e.g., at most 425 nm, at most 375 nm, at most 360 nm, at most 325 nm, at most 275 nm, at most 250 nm, at most 225 nm, at most 200 nm, or at most 175 nm. In one example, the radiation has a wavelength including 436 nm, 405 nm, 365 nm, 355 nm, 248 nm, 193 nm, 157 nm, and/or 126 nm. In one example, the radiation includes a wavelength of around 365 nm or around 355 nm. In one example, the radiation includes a broad band of wavelengths, for example encompassing 365, 405, and 436 nm. A 355 nm laser source could be used. The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF2 (e.g., an interferometric device, linear encoder, capacitive sensor, or the like), the substrate table WT can be moved accurately, e.g., so as to position different target portions C in the path of the radiation beam B. Where used, the positioning means for the array of individually controllable elements can be used to correct accurately the position of the patterning device PD with respect to the path of the beam B, e.g., during a scan.

In one example, movement of the substrate table WT is realized with the aid of a long-stroke module (course positioning) and a short-stroke module (fine positioning), which are not explicitly depicted in FIG. 1. In one example, the apparatus is absent at least a short stroke module for moving substrate table WT. A similar system can also be used to position the array of individually controllable elements. It will be appreciated that the beam B can alternatively/additionally be moveable, while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. In one example, the beam of radiation is directed at the patterning device at an angle between 0 and 90°, e.g., between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 can not be required if a transmissive patterning device is used.

The depicted apparatus can be used in several modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the beam B is caused to scan a line across the substrate W. The pattern on the array of individually controllable elements is updated as required between pulses of the radiation system and the pulses are timed such that successive target portions C are exposed at the required locations on the substrate W. Consequently, the beam B can scan across the substrate W to expose the complete pattern for a strip of the substrate. The process is repeated until the complete substrate W has been exposed line by line.

4. In continuous scan mode, essentially the same as pulse mode except that the substrate W is scanned relative to the modulated beam of radiation B at a substantially constant speed and the pattern on the array of individually controllable elements is updated as the beam B scans across the substrate W and exposes it. A substantially constant radiation source or a pulsed radiation source, synchronized to the updating of the pattern on the array of individually controllable elements, can be used.

5. In pixel grid imaging mode, which can be performed using the lithographic apparatus of FIG. 2, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary. These can be not only to maximum or minimum intensity levels, but also to intensity levels between the maximum and minimum intensity levels. This is commonly referred to as "grayscaling."

Grayscaling provides greater control of the position of the pattern feature boundaries than is possible in a lithography system in which the radiation intensity provided to the substrate by a given individually controllable element can only be set to two values (namely just a maximum value and a minimum value). In an embodiment, at least three different radiation intensity values can be projected onto the substrate, e.g., at least 4 radiation intensity values, at least 8 radiation intensity values, at least 16 radiation intensity values, at least 32 radiation intensity values, at least 64 radiation intensity values, at least 128 radiation intensity values, or at least 256 radiation intensity values.

It should be appreciated that grayscaling can be used for additional or alternative purposes to that described above. For example, the processing of the substrate after the exposure can be tuned, such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling can be used to provide a radiation dose profile across the substrate having more than two desired dose levels. In an embodiment, the radiation dose profile has at least 2 desired dose levels, e.g., at least 3 desired radiation dose levels, at least 4 desired radiation dose levels, at least 6 desired radiation dose levels or at least 8 desired radiation dose levels.

It should further be appreciated that the radiation dose profile can be controlled by methods other than by merely controlling the intensity of the radiation received at each point on the substrate, as described above. For example, the radiation dose received by each point on the substrate can alternatively or additionally be controlled by controlling the duration of the exposure of the point. As a further example, each point on the substrate can potentially receive radiation in a plurality of successive exposures. The radiation dose received by each point can, therefore, be alternatively or additionally controlled by exposing the point using a selected subset of the plurality of successive exposures.

In order to form the required pattern on the substrate, it is necessary to set each of the individually controllable elements in the patterning device to the requisite state at each stage during the exposure process. Therefore, control signals, representing the requisite states, must be transmitted to each of the individually controllable elements. In one example, the lithographic apparatus includes a controller that generates the control signals. The pattern to be formed on the substrate can be provided to the lithographic apparatus in a vector-defined format, such as GDSII. In order to convert the design information into the control signals for each individually controllable element, the controller includes one or more data manipulation devices, each configured to perform a processing step on a data stream that represents the pattern. The data manipulation devices can collectively be referred to as the "datapath."

The data manipulation devices of the datapath can be configured to perform one or more of the following functions: converting vector-based design information into bitmap pattern data; converting bitmap pattern data into a required radiation dose map (namely a required radiation dose profile across the substrate); converting a required radiation dose map into required radiation intensity values for each individually controllable element; and converting the required radiation intensity values for each individually controllable element into corresponding control signals.

FIG. 2 depicts an arrangement of the OML apparatus according to the present invention. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

FIG. 2 depicts an arrangement of a lithographic apparatus, according to one embodiment of the present invention. This embodiment can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

As shown in FIG. 2, the projection system PS includes a beam expander, which comprises two lenses L1, L2. The first lens L1 is arranged to receive the modulated radiation beam B and focus it through an aperture in an aperture stop AS. A further lens AL can be located in the aperture. The radiation beam B then diverges and is focused by the second lens L2 (e.g., a field lens).

The projection system PS further comprises an array of lenses MLA arranged to receive the expanded modulated radiation B. Different portions of the modulated radiation beam B, corresponding to one or more of the individually controllable elements in the patterning device PD, pass through respective different lenses in the array of lenses MLA. Each lens focuses the respective portion of the modulated radiation beam B to a point which lies on the substrate W. In this way an array of radiation spots S is exposed onto the substrate W. It will be appreciated that, although only eight lenses of the illustrated array of lenses 14 are shown, the array of lenses can comprise many thousands of lenses (the same is true of the array of individually controllable elements used as the patterning device PD).

A pattern on a substrate W may be generated using the system of FIG. 2, according to one embodiment of the present invention by projecting an array of spots S onto the substrate W by the array of lenses MLA in the projection system PS. The substrate W is moved relative to the projection system PS in the Y direction as a series of exposures are exposed on the substrate W. The open circles represent spot exposures SE that have previously been exposed on the substrate W. Each spot projected onto the substrate by the array of lenses within the projection system PS exposes a row R of spot exposures on the substrate W. The complete pattern for the substrate is generated by the sum of all the rows R of spot exposures SE exposed by each of the spots S. Such an arrangement is commonly referred to as "pixel grid imaging," discussed above.

For example, the array of radiation spots S may be arranged at an angle $\theta$ relative to the substrate W (the edges of the substrate lie parallel to the X and Y directions). This is done so that when the substrate is moved in the scanning direction (the Y-direction), each radiation spot will pass over a different area of the substrate, thereby allowing the entire substrate to be covered by the array of radiation spots 15. In one example, the angle $\theta$ is at most 20°, 10°, e.g., at most 5°, at most 3°, at most 1°, at most 0.5°, at most 0.25°, at most 0.10°, at most 0.05°, or at most 0.01°. In one example, the angle $\theta$ is at least 0.001°.

In an OML system, such as shown in FIGS. 1-2, which are a single pulse tools, each pulse tool is ideally desired with a zero pointing and a zero positioning errors for a beam of light going into an illumination system. A typical laser beam of a single pulse itself may be off by a few millimeters (mm) or milliradians (mrad). This makes a single pulse printing difficult.

Referring to FIG. 3, it schematically depicts an optical apparatus 100 consistent with one embodiment of the present invention. The optical apparatus 100 may comprise a first beam control module 200 (1) having a first optics 205 (1) in an optical axis 210 for optically isolating a laser pulse 215 from a light source 220 associated with an illuminator 300 according to an embodiment of the present invention, as shown in FIG. 2.

Embodiments of the present invention provides a way to isolate the light source 220 which provides the laser pulse 215 for forming the beam of light 305. By optically isolating the laser pulse 215 from the light source 220 that provides a beam of light 305, the optical apparatus 100 may control fluctuations in one or more of a beam pointing error, a beam positioning error, a beam size error or a beam divergence error of the beam of light 305.

According to one embodiment of the present invention, a beam pointing error refers to a change in direction of the beam of light 305 as measured by the centroid of the angular space. Likewise, a beam position error may refer to a change in location of the beam of light 305 from the optical axis 210 as measured by the centroid. A beam size error may refer to a change in beam size as measured by the width of the 5% (or 10%, $1/e^2$, etc) intensity points. Finally, a beam divergence error may refer to a change in beam divergence as measured by the width of the 5% (or 10%, $1/e^2$, etc) angular space intensity points.

For example, an OML system such as shown in FIGS. 1-2, consistent with one embodiment of the present invention, about 3 micron beam position errors and 3 micro-rad beam pointing errors may be achievable with a Beam Symmetry Shaper (BSS) and a two plate homogenizer as described in detail later. However, beam related errors such as beam divergence errors and beam size errors are a function of manufacturing tolerances on the optics and may be accordingly specified based on a specific application. In this way, one or more of a beam pointing error, a beam positioning error, a beam size error or a beam divergence error of the beam of light 305 may be stabilized to a desired level.

Likewise, symmetry may be desirably specified for a particular system In this way, a desired performance at a wafer plane that may be acceptable in an OML tool may be obtained.

The first beam control module 200 (1) may selectively stabilize the beam pointing error, beam positioning error, beam size error and/or beam divergence error by either homogenizing selectively the spatial field or angular information of a given illumination profile for the beam of light 305 and symmetrizing other one of the spatial field or angular information which is not being homogenized based on a first arrangement 310 (1) of the first optics 205 (1) or homogenizing and symmetrizing both of the spatial field and angular information based on a second arrangement 310 (1) of the first optics 205 (1). According to one embodiment of the present invention, angular homogenization may refer to the tendency of the intensity profile in angle space to be top hat in shape. Likewise, spatial homogenization may refer to the tendency of the intensity profile in field space to be top hat in shape. Spatial symmetry may refer to the tendency of the field space to be symmetric along either side of the desired direction of propagation. Finally, angle symmetry may refer to the tendency of the angle space to be symmetric along either side of the desired direction of propagation.

In operation, the first beam control module 200 (1) may stabilize the output from the light source 220 by controlling divergence errors such that the beam of light 305 becomes stationary in pointing and position before entering an illumination system 302. Ideally, the first beam control module 200 (1) provides a beam 303 with stationary position, stationary pointing and in an OML system the beam 303 with a certain beam size and beam divergence levels that may be acceptable. For example, the optical apparatus 100 may provide the beam 303 with a desired size and divergence level values, as included in FIG. 4. In this way, the beam 303 may be provided with a desired beam size, beam pointing, beam positioning and beam divergence errors.

Besides the first beam control module 200 (1), the optical apparatus 100 may optionally comprise a second beam control module 200 (2) with a second optics (205 (2) for providing a complete control of all four beams errors including the beam size, beam pointing, beam positioning and beam divergence. In another configuration of the optical apparatus 100, by using different arrangements such as the first and second arrangements 310 (1, 2) of the first optics 205 (1) in combination with a second optics 205 (2) selectively any one or more of the beam error parameters described herein may be desirably or partially controlled.

The second beam control module 200 (2) having the second optics 205 (2) may be coupled to the first beam control module 200 (1) in the optical axis 210 to receive the beam of light 305. The second beam control module 200 (2) may stabilize at least two of the remaining two or three of the beam pointing error, beam positioning error, beam size error or beam divergence error that are not stabilized by the first beam control module 200 (1).

FIGS. 4A and 4B schematically depict the first arrangement 310 (1) of the first optics 205 (1) shown in FIG. 3, according to one exemplary embodiment of the present invention. FIGS. 4A and 4B are illustrated in a 90° rotation apart such that FIG. 4A is a side view and FIG. 4B is a top view of the first arrangement 310 (1). The first arrangement 301 (1) comprises a first rectangular plate 400 (1) disposed in the optical axis 210, on an input plane 402 (1). The first arrangement 301 (1) further comprises a second rectangular plate 400 (2) orthogonal to the first rectangular plate 400 (1). In one embodiment, the first and second rectangular plates 400 (1, 2) may be homogenizer plates having two flat surfaces that may be separated by, for example, 0.3 mm. Each plate 400 (1, 2) may be 90 mm long and 20 mm deep.

In operation, the laser beam 215 may be split in two orthogonal directions namely x-direction and y-direction. The first rectangular plate 400 (1) may handle the x-direction and the second rectangular plate 400 (2) may handle the y-direction separately.

The first arrangement 310 (1) may comprise a first condenser lens 405 (1) disposed on one side of the first rectangular plate 400 (1) at which the laser beam 215 enters. On the other side opposing the first rectangular plate 400 (1), a second condenser lens 405 (2) may be disposed along with a third condenser lens 405 (3) at a first side of the second rectangular plate 400 (2). At the other side of the second rectangular plate 400 (2), a fourth condenser lens 405 (4) may be disposed in the first arrangement 301 (1) to provide an output plane 402 (2) as an object plane. In one embodiment, the condenser lens 405 (1-4) may comprise cylindrical optics.

As shown in FIG. 4A, light is traveling in a z-axis that is orthogonal to x-axis and y-axis, going into the page. Accordingly, when the laser beam 215 comes into the first arrangement 310 (1), the first rectangular plate 400 (1) homogenizes it and sends it out to the second condenser lens 405 (2), which forms an image of the laser beam. For the laser beam 215 entering in the first arrangement 310 (1) in the xy-plane of the paper, it has a divergence of 0.9 mrad and a beam size of 12.2 mm since it is not homogenized so can have a Gaussian shape, for example. At the end of the first arrangement 310 (1), once the laser beam 215 travels through the two plates 400 (1,2) and four condenser lenses 405 (1-4), the beam size of the beam of light 305 shrinks to 10.7 mm with the divergence of 2 mrad but this beam still has a given illumination profile. As can be seen, the divergence of 0.9 mrad changes to 2 mrad, providing a uniform beam as the beam 303 that is relatively stable. In this way, regardless of the beam divergence at the input plane 402 (1), such as 0.9 mrad, the beam divergence at the output plane 402 (2) would result in the beam divergence of 2 mrad. Thus, it is a stable position of the beam 303 with a desired divergence error, i.e., how fast the laser beam 215 is spreading out at the output plane 402 (2) and having a size of beam width of 10.7 mm.

In FIG. 4B, the first arrangement 310 (1) is rotated 90°. As shown in FIG. 4B, for the y-direction, going into the plane of page, the laser beam 215 is coming through orthogonally with a divergence of 1.7 mrad and a beam size of 12.2 mm. The beam of light 305 goes through the first condenser lens 405 (1) which may be cylindrical optics that acts only in one direction of light propagation. That is, the condenser lens 401 (1) and the second condenser lens 405 (2) are cylindrical optics with no power in y-direction of the light's path. When the light reaches the third condenser lens 405 (3), it focuses the light in the second rectangular plate 400 (2), which scrambles the light around. The fourth condenser lens 405 (4) focuses the light back on to the output plane 402 (2) as an object plane that coalesce.

An output beam 305 (1) is a beam with a divergence error of 2 mrad and a beam size of 13.1 mm. The output beam 305 (1) of size 13.1 mm may have the same structural shape of the input beam, i.e., the beam of light 305. For example, if the input beam would be of a shape as a top hat or a Gaussian or a triangular the output beam 305 (1) will be of the similar shape. But regardless of the beam divergence of 1.7 mrad of the input beam, the beam divergence error of the output beam would be 2 mrad. In this way, the first and second rectangular plates 400 (1-2) homogenize and stabilize the beam divergence error. So, no matter what the divergence error of the input beam, e.g., the beam of light 305 may be, the output beam 305 (1) would result in a smooth top hat shape with a 2 mrad profile.

By adding the second beam control module 200 (2) with the second optics 205 (2) having two more rectangular plates 400, the beam size of the beam of light 305 may be homogenized. So, now not only the output beam would have a constant 2 mrad beam divergence error but also have a top hat profile of 10.7 mm by 13.1 mm. In other words, a combination of four rectangular plates 400 (1-4) of the first and second optics 205 (1-2) of the respective first and second beam control modules 200 (1-2) may stabilize the beam position, pointing, divergence and size errors.

Referring to FIG. 5, it schematically depicts the second arrangement 310 (2) of the first optics 205 (1) shown in FIG. 3, according to one illustrative embodiment of the present invention. The second arrangement 310 (2) is schematically shown for the first optics 205 (1) of the first beam control module 200 (1) in accordance with one illustrative embodiment of the present invention to comprise the first and second rectangular plates 400 (1, 2) each having a pair of parallel plates or surfaces disposed in a horizontal or vertical configurations. In FIG. 5, a horizontal configuration of the first and second rectangular plates 400 (1, 2) is shown consistent with one embodiment of the present invention. In this example, field size and divergence may depend on size of the plates 400 (1, 2).

The second arrangement 310 (2) may further comprise the first condenser lens 405 (1) disposed at the input of the first optics 205 (1) at one side of the first rectangular plate 400 (1). On the other side away from the input of the first optics 205 (1), the second arrangement 310 (2) may comprise a first relay lens 505 (1) followed by a second relay lens 505 (2). For example, a first relay may include such a pair of lens having power 40.7× and the first condenser lens 405 (1) may be with a focal length f=150 mm. The combination of the first condenser lens 405 (1) with the first rectangular plate 400 (1) and first and second relay lenses 505 (1-2) may provide NA homogenization or correction of a divergence error.

The second arrangement 310 (2) may further comprise the second condenser lens 405 (2) disposed after the second relay 505 (2) and the second rectangular plate 400 (2) disposed thereafter. A third relay lens 505 (3) and a fourth relay lens 505 (4) may be disposed next to the second rectangular plate 400 (2) side by side at the output of the first optics 205 (1). While a second relay may include such a pair of lens that provide a power of 40.7×, the second condenser lens 405 (2) may have a focal length f=150 mm as shown in the illustrated embodiment of the present invention. The combination of the second condenser lens 405 (2) with the second perpendicular plate 400 (2) and the third and fourth relay lenses 505 (3-4) may provide spatial homogenization.

That is, this combination takes in the beam of light 305 with 2 mrad of a divergence error and a beam size of 12.2 mm to provide a beam of light with the divergence error of 2 mrad and the beam size of 12.2 mm as both of them being stabilized. In other words, both the angular and spatial components of an output beam of light 305 (2) become a top hat shape by being insensitive to the input beam of light 305. Accordingly, even if the shape or size of the beam of light 305 at the input of the second arrangement 310 (2) varies to some extent, the output beam of light 305 (2) will stay to be of size 12.2 mm with a divergence of 2 mrad.

Referring back to FIGS. 4A-4B, the first beam control module 200 (1) for providing angular homogenization or correction for a divergence error is shown, whereas FIG. 5 shows an arrangement that provides both angular and spatial homogenization. By having a beam control module appended to the second arrangement 310 (2) by using it in an orthogonal direction with respect to the first beam control module 200 (1), a correction for angle and space in the other orthogonal direction may be obtained. That is, by linking the first beam control module 200 (1) having the second arrangement 310 (2) with the second beam control module 200 (2) having the second optics 205 (2) orthogonal but similar to the second arrangement 310 (2), a desired correction for all four beam errors including the size, positioning, pointing and divergence may be obtained.

By using the first arrangement 310 (1) of FIGS. 4A-4B, angular homogenization may be provided. Likewise, the spatial field homogenization may be obtained with different optics than used for the first optics 205 (1) of the first arrangement 310 (1). As shown in one dimension, in FIG. 5, both spatial and angular homogenization may be obtained in x-direction. To obtain both of these homogenizations in the y-direction, another set of optics orthogonal to the first set of optics as described above can be obtained. In all of these cases set forth above, when the specific optics arrangement homogenizes a beam, such as the beam of light 305 at the input, it also symmetrizes that beam. In other words, by homogenizing the beam of light 305, a top hat profile may be obtained.

Referring to FIG. 6, it schematically depicts the optical apparatus 100 comprising the first beam control module 200 (1) shown in FIG. 3 and the second beam control module 200 (2) having the second optics 205 (2) coupled to the first beam control module 200 (1) in the optical axis 210 to receive the beam of light 305, according to one illustrative embodiment of the present invention. With an arrangement of the first optics 205 (1) having the two plates such as 400 (1-2), the optical apparatus 100 may perform homogenization and symmetry of angular space but spatial field is not homogenized or symmetrized. To do this, one option is to add additional plates or to make a beam just symmetric and not homogenize, a beam symmetry shaper (BSS) 605 may be used in a combination with the second beam control module 200 (2) having the second optics 205 (2), as shown in FIG. 6, as an arrangement 600, according to one embodiment of the present invention. The BSS 600 makes the spatial field symmetric but it does not homogenize it.

In an OML system, such as described in FIGS. 1-2, a fully homogenized spatial field may not be desired but only a symmetric field may suffice. However, in order to provide an angular space application, a symmetric and homogenized spatial field is desired. In the second beam control module 200 (2), the second optics 205 (1) may comprise two plates 400 (1,2) to provide angular homogenization and to symmetrize the spatial field the BSS 605 may include a beam splitter 610 to split an incident beam 305a in x-direction. In such an OML system, another splitter may be provided for the y-direction. In one embodiment, the beam splitter 610 may be a 30/70 splitter.

When the incident beam 305a arrives at the BSS 605, a part of this beam goes straight through, as shown by an arrow 615. For example, about 30% goes straight through a path compensator 520 as an output beam 305b. As shown, about 70% of the incident beam 305a is reflected on to a first mirror 625 (1) as a reflected beam 305c and it comes back to the beam splitter 610 and transmitted. At a second time when it is reflected, 70% of the original 70% is added to the reflective beam 305c, i.e., about 49% is reflected back and added to the reflected beam 305c.

The BSS 605 may further comprise a first lens 630 (1) and a second lens 630 (2) that invert the incident beam 305a. One of the first and second lenses 630 (1,2) may be slanted to left and the other one of the two to the right by about an equal amount such that beams of light traveling through them provide a balanced profile. While the BSS 605 turns pointing and position shifts into divergence and width changes, without the lenses 630 (1,2), the BSS 605 provide a normal pulse stretching functionality.

A cyclic pass of the incident beam 305a across a set of four mirrors 625 (1-4) and the first and second lenses 630 (1,2) may invert the beam. In this way, the BSS 605 may stretch the pulse and keep adding components of the incident beam 305a to the reflected beam 305c. That is, the first and second lenses 630 (1,2) image reflected beam back on itself but an inverted one. Each path of the light of the incident beam 305a through the lenses 630 (1,2) inverts the beam.

To control three of the four beam errors for the angular space, both the beam divergence and stability in pointing is provided by the arrangement 600 since it homogenizes the incident beam 305a to make it symmetric. For the spatial space, the arrangement 600 may control symmetry by using the BSS 605 without controlling the beam size error. So, the beam size can grow from 12.2 mm symmetrically on both sides. But the beam pointing is controlled once the incident beam 305a is made symmetric by the BSS 605 as the pointing error is counted on the other side such that the centroid stays zero.

The BSS 605 with inverting optics may symmetrize the spatial field and angular information of the given illumination profile for the beam of light 305. Additionally, a first and a second homogenizer plates such as the plates 400 (1,2) may be coupled to the BSS 605 for homogenizing selectively the spatial field and/or angular information and symmetrizing the other one of the spatial field or angular information which is not being homogenized.

The first arrangement 310 (1) of the first optics 205 (1) may comprises a first and a second homogenizer plates such as the plates 400 (1,2) for homogenizing selectively the spatial field and/or angular information and symmetrizing the other one of the spatial field or angular information which is not being homogenized in a first direction by the first and second homogenizer plates. The second optics 205 (2) of the second beam control module 200 (2) may likewise comprise a third and a fourth homogenizer plates for homogenizing selectively the spatial field and/or angular information and symmetrizing the other one of the spatial field or angular information which is not being homogenized in a second direction orthogonal to the first direction by the third and fourth homogenizer plates. Alternatively, the second arrangement 310 (2) of the first optics 205 (1) of the first beam control module 200 (1) may comprise a first and a second homogenizer plates for homogenizing and symmetrizing both the spatial field and angular information of the given illumination profile for the beam of light 305 in a first direction. The second optics 205 (2) of the second beam control module 200 (2) further comprises a third and a fourth homogenizer plates coupled to the first and second homogenizer plates for homogenizing and symmetrizing both the spatial field and angular information in a second direction orthogonal to the first direction. In this way, the first and second beam control modules 200 (1,2) may enable lithographic processing of a substrate.

Referring to FIGS. 7A-7B, a combination of the BSS 605 with the first arrangement 310 (1) in x-direction and 310 (1) in the y-direction is illustrated as an arrangement 700 according to one embodiment of the present invention. In FIGS. 7A-7B, the BSS 605 with inverting optics for the second optics 205 (2) of the second beam control module 200 (2) may symmetrize spatial field and angular information of a given illumination profile for the beam of light 305 according to one illustrative embodiment of the present invention. According to one embodiment of the present invention, spatial field information may refer to a general profile of the light across x- and y-dimensions. Likewise, angular information may refer to a general profile of light in angular space across appropriate angular dimension, i.e., rotation about the x-coordinate, rotation about the y-coordinate. Finally, an illumination profile may refer to a general distribution of light in the beam of light 305.

The first and second homogenizer or rectangular plates 400 (1,2) coupled to the BSS 605 from the first arrangement 310 (1) of the first optics 205 (1) of the first beam control module 200 (1) may enable the arrangement 700 to symmetrize spatial field and angular information of the given illumination profile. In the arrangement 700, the BSS 605 symmetrizes the incident beam 305a in the spatial space then the first and second rectangular plates 400 (1-2) of the first arrangement 310 (1) symmetrize and homogenize the incident beam 305a in the angular space. With another set of rectangular plates (not shown) disposed next to the first arrangement 310 (1), the arrangement 700 may symmetrize and homogenize the incident beam 305a in both the x-direction and y-direction. So, the arrangement 700 symmetrizes the spatial and angular space for the incident beam 305a and homogenizes the angular space for the incident beam 305a. But the spatial beam can still grow in size since it is not stabilized by the arrangement 700.

According to one embodiment of the present information, the first and second optics 205 (1,2) may comprise optical material including Calcium fluoride (CaF2), fused silica using high reflective coating for the plates 400 (1,2). Calcium fluoride (CaF2) is an insoluble ionic compound of calcium and fluorine. It occurs naturally as the mineral fluorite (also called fluorspar). The first and second optics 205 (1,2) may be fabricated using any one or more of suitable standard fabrication techniques to make a flat plate surface. The two flat plate surfaces of each 400 (1,2) may be held apart in separation via known mechanical means.

Referring to FIG. 7C, an integrated beam control module 800 that combines a vertical module 805 (1) with a horizontal module 805 (2), such as shown in FIGS. 4A and 4B respectively, is schematically illustrated in accordance with one embodiment of the present invention. The vertical module 805 (1) with the horizontal module 805 (2) may control beam size, divergence, pointing and positioning errors according to one embodiment of the present invention. For this purpose, in the vertical module 805 (1), an image plane goes through a first set of plates but in the orthogonal direction it has a path distance to make up in which a beam can grow. To compensate for this effect, a relay optics such as a horizontal relay 810 (1) may be provided in the vertical module 805 (1). This horizontal relay 810 (1) is used to relay from an orthogonal direction an input plane to an output plane of the vertical module 805 (1). Similarly, a vertical relay 810 (2) may be introduced or inserted in the horizontal module 805 (2) to image from an input plane of the horizontal module 805 (2) to its output plane.

To obtain a maximum transmission between the horizontal and the vertical modules 805 (1, 2), a first waveplate (WP) 815 (1) may be disposed between the horizontal and the vertical modules 805 (1, 2) to rotate the polarization 90° and ensure a relatively high efficiency signal transmission through both the plates. Optionally, a second waveplate (WP) 815 (2) may be disposed at the output plane of the horizontal module 805 (2). In one embodiment, the horizontal relay 810 (1) may be inserted into the first arrangement 310 (1) shown in FIG. 4A and likewise the vertical relay 810 (2) may be inserted into the first arrangement 310 (10 shown in FIG. 4B.

In operation, although the beam of light 305 can freely propagate through the plates 400 (1, 2), but this beam of light 305 can grow in divergence. While the plates 400 (1, 2) homogenize the beam of light 305, they do not isolate the light source 220 from the illumination system 302, as shown in FIG. 3. The horizontal and vertical relays 810 (1, 2) ensure that the beam of light 305 is stable in positioning and pointing. The horizontal and vertical relays 810 (1, 2) image the input field to the output field by avoiding the free propagation. After performing homogenization in one direction and relaying the orthogonal direction to the same plane, the beam size and divergence of the beam of light 305 may be conserved through the first arrangement 310 (1) having the horizontal relay 810 (1) in an OML system.

By isolating the beam of light 305, in one embodiment, the integrated beam control module 800 ensures that the output beam does not see any movement in the input beam in position, pointing, grow in size or shrink in size since the output stays stable. So, the plates 400 (1, 2) may be used for further spatial field homogenization and symmetrization and other two plates 400 (3, 4) may be used of angular space homogenization and symmetrization to control all four beam errors in size, pointing, positioning and divergence. Since the BSS 605 does not maintain size of the beam of light 305, it only provides half the functionality that the two plates 400 (1, 2) provide. So the BSS 605 can be used for symmetrization of either one of the spatial field or the angular space, but it does not provide homogenization.

Referring to FIG. 8A, it schematically depicts an optical apparatus 840 including a x-direction angle space homogenizer 845 (1) for angular homogenization and/or spatial symmetry, according to one illustrative embodiment of the present invention. Referring to FIG. 8B, it schematically depicts the optical apparatus 840 including a y-direction angle space homogenizer 845 (2) for angular homogenization and/or spatial symmetry, according to one illustrative embodiment of the present invention.

In addition, FIGS. 8A and 8B shows components of the optical apparatus 840 such as the illuminator IL, according to one embodiment of the present invention. The illuminator IL components comprise a set of condensers with lenses and a waveplate. It is to be appreciated that the illuminator components shown in FIGS. 8A and 8B can be used in the illuminators IL shown in FIGS. 1 and/or 2. Also, it is to be appreciated that the illuminator components shown in FIGS. 8A and 8B can be used instead of, or in addition to, some or all of the components of the illuminator components shown in FIG. 1.

In one example, the x-direction angle space homogenizer 845 (1) comprises first and second reflectors 850 (1,2) which are parallel to one another and equidistant from a light source. The first and second reflectors 850 (1,2) can comprise flat outer surfaces of a suitably dimensioned piece of, for example, quartz, or any other suitable material. Alternatively, the first and second reflectors 850 (1,2) can comprise two parallel mirrors. The positions and orientations of the mirrors can be adjustable in order to optimize their operation.

In one example, the light source is arranged to generate a beam of light 305, and can, for example, comprise a laser, or can instead be an output from a beam delivery system arranged to deliver light from a laser. The term 'light' should not be interpreted as being limited to electromagnetic radiation in the visible spectrum, but instead should be understood to include any wavelength of electromagnetic radiation which is suitable for use in lithography, as discussed above.

Referring to FIG. 9A, it schematically depicts the optical apparatus 900 including a x-direction spatial homogenizer 905 (1) for spatial homogenization and/or angle symmetry, according to one illustrative embodiment of the present invention. Referring to FIG. 9B, it schematically depicts the optical apparatus 900 including a y-direction spatial homogenizer 905 (2) for spatial homogenization and/or angle symmetry, according to one illustrative embodiment of the present invention. In addition, FIGS. 9A and 9B shows components of the illuminator IL, according to one embodiment of the present invention. The illuminator IL components comprise a set of relays and a waveplate. It is to be appreciated that the illuminator components shown in FIGS. 9A and 9B can be used in the illuminators IL shown in FIGS. 1 and/or 2. Also, it is to be appreciated that the illuminator components shown in FIGS. 9A and 9B can be used instead of, or in addition to, some or all of the components of the illuminator components shown in FIG. 1.

Referring to FIG. 10A, it schematically depicts a top view of optical apparatus 1000 including a x-direction and y-direction angular/spatial homogenizer 1005 (1,2), according to one illustrative embodiment of the present invention. Referring to FIG. 10B, it schematically depicts a side view of the optical apparatus 1000 including a x-direction and y-direction angular/spatial homogenizer 1005 (3,4), according to one illustrative embodiment of the present invention. In addition, FIGS. 10A and 10B shows components of the illuminator IL, according to one embodiment of the present invention. The illuminator IL components comprise a set of relays and a set of condensers and a set of waveplates. It is to be appreciated that the illuminator components shown in FIGS. 10A and 10B can be used in the illuminators IL shown in FIGS. 1 and/or 2. Also, it is to be appreciated that the illuminator components shown in FIGS. 10A and 10B can be used instead of, or in addition to, some or all of the components of the illuminator components shown in FIG. 1.

Figure 11A:
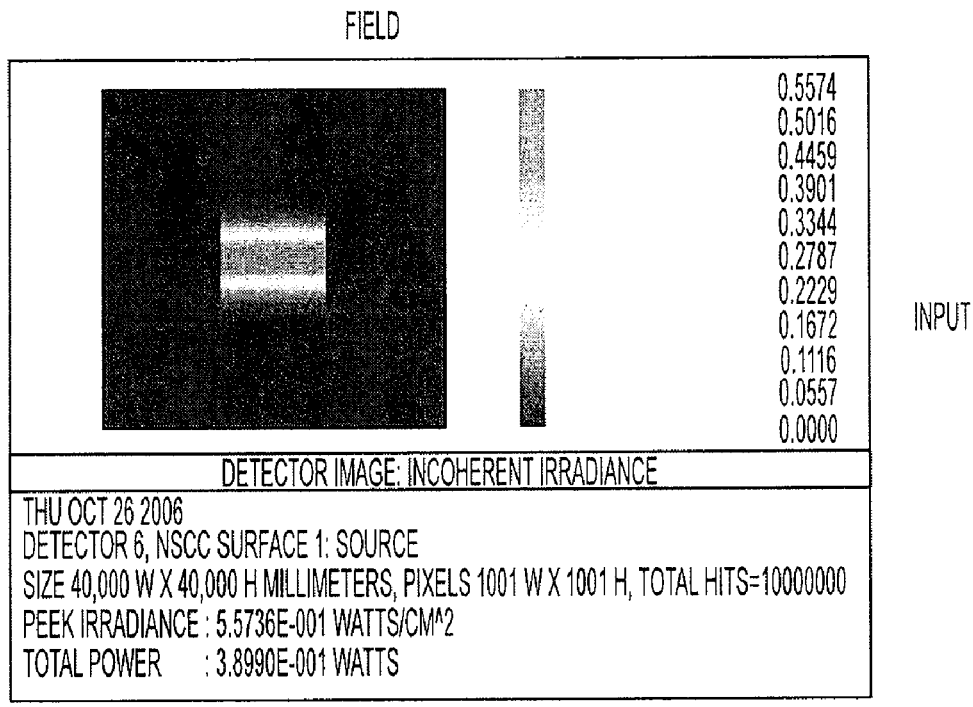
Figure 11B:
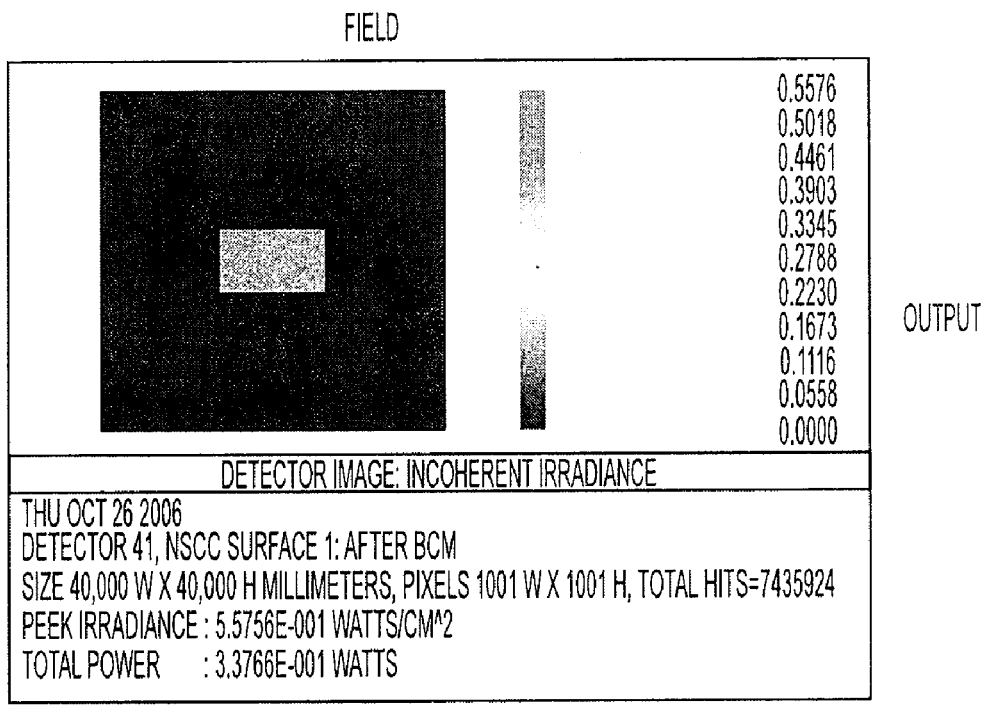
Figure 12A:
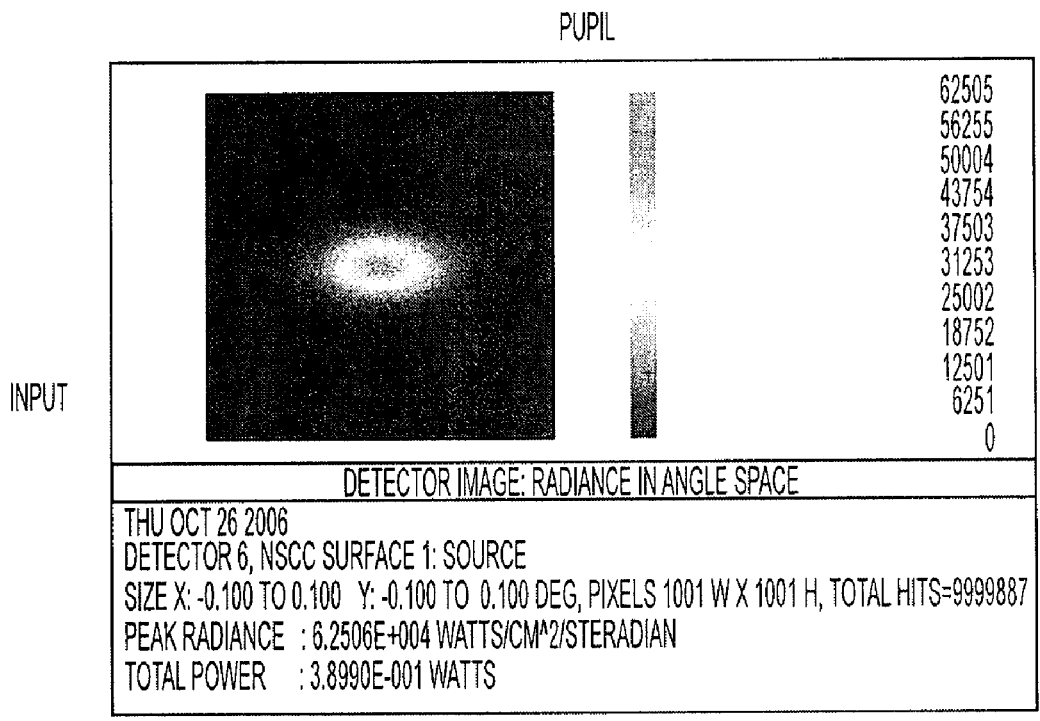
Figure 12B:
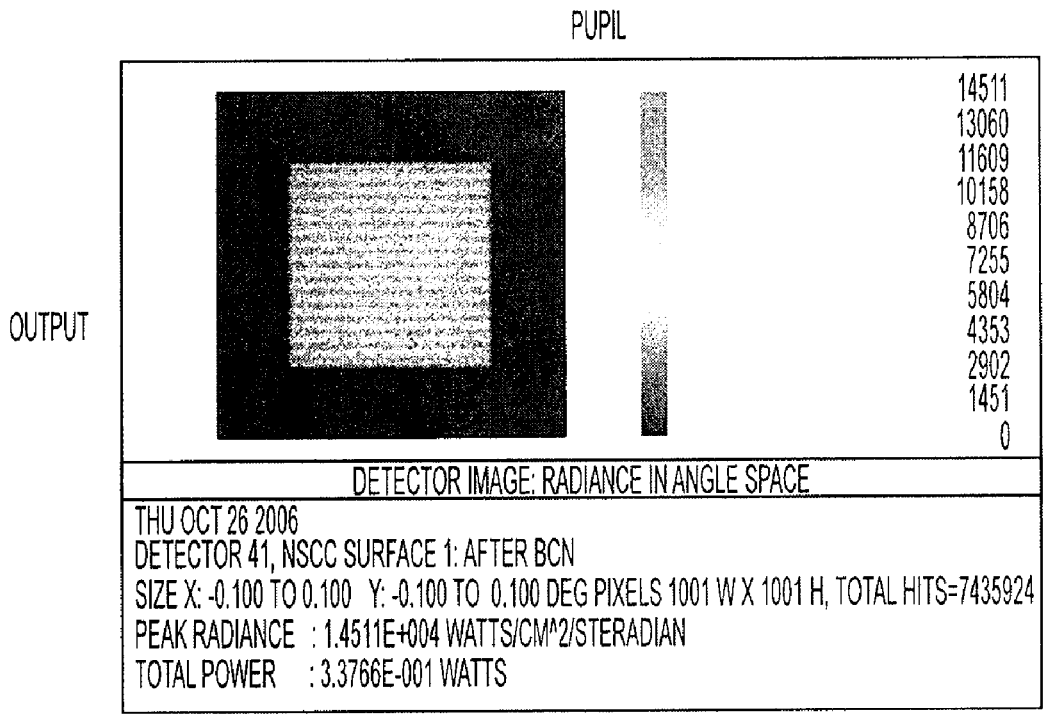
Figure 13A:
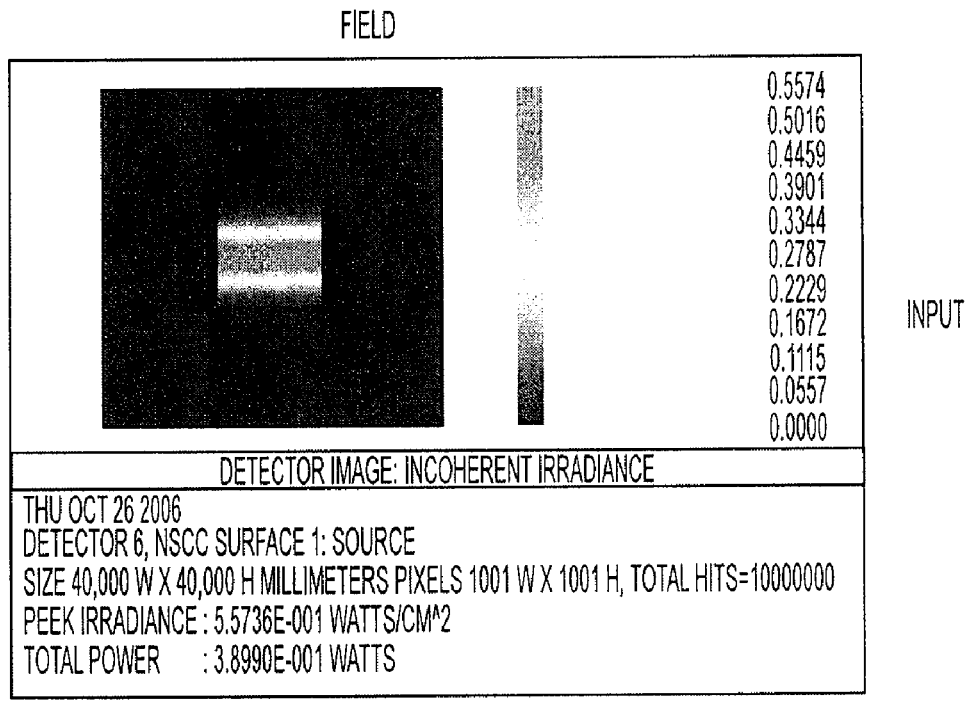
Figure 13B:
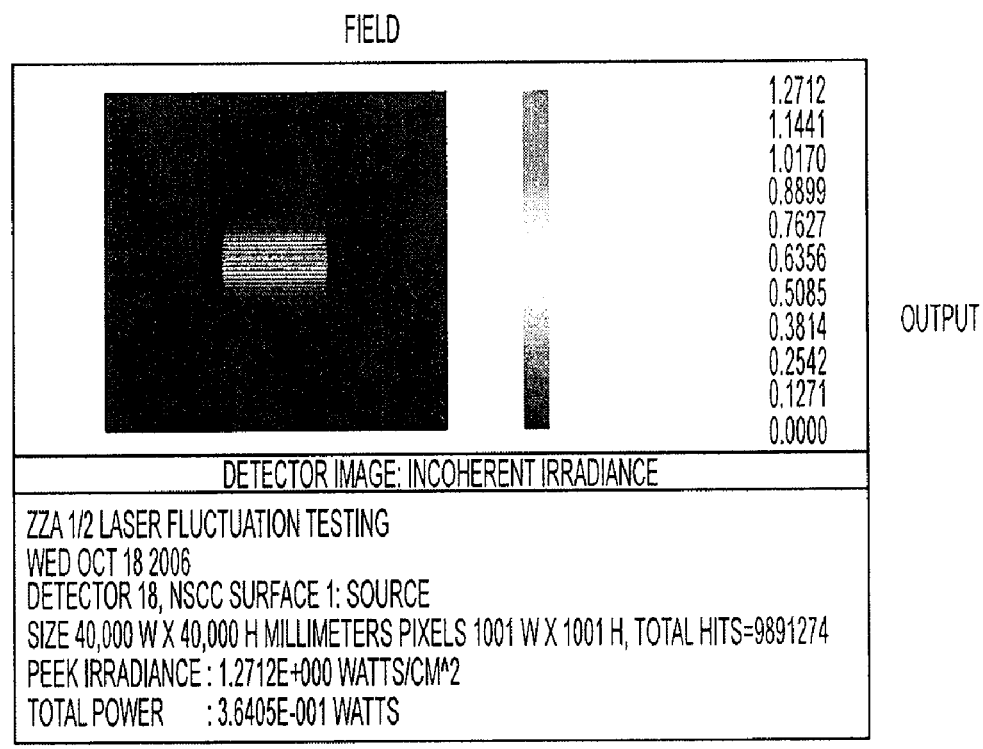

Referring to FIGS. 11A-11B and 12A-12B, in FIG. 11B, output images at a detector appear to be rectangular whereas an image at FIG. 11A shows the spatial field, according to one illustrative embodiment of the present invention. Examples of a laser profile are shown in FIGS. 11A and 12A. In the angular space at the pupil plane, FIG. 12A shows a Gaussian roll in both directions whereas the output image in FIG. 12B appears to be relatively symmetric, according to one illustrative embodiment of the present invention. For example, in FIG. 11B, the output images at the detector appear to be rectangular whereas the image at FIG. 11A shows the spatial field rolling off with a non uniform illumination profile. In the angular space at the pupil plane, FIG. 12A shows a Gaussian roll in both directions whereas the output image in FIG. 12B appears to be relatively symmetric with the homogenization shown with some ripples in a square or rectangular pattern. For this output image shown in FIG. 12B, the intensity profile will be relatively smooth. It symmetrizes the input beam, as the pattern for the output beam shown in FIG. 12B indicates a roll off with a skew to one side so that the symmetrized output would mirror to itself by adding to itself. So, homogenizing implies having a smooth output intensity and symmetry implies adding a mirror image of an input side-by-side to the input itself for providing a symmetric output. For example, a centroid of a pattern after symmetry would be a zero instead of being offset.

FIGS. 11A-11B and 12A and 12B schematically show input and output images of a detector for the optical apparatus 100 with both the first and second beam control modules 200 (1,2) coupled together, as described above, in accordance with one embodiment of the present invention. FIGS. 11A-11B depict input and output images respectively for the spatial field correction and FIGS. 12A-12B likewise depict divergence correction at a pupil plane, e.g., NA homogenization.

Figure 14A:
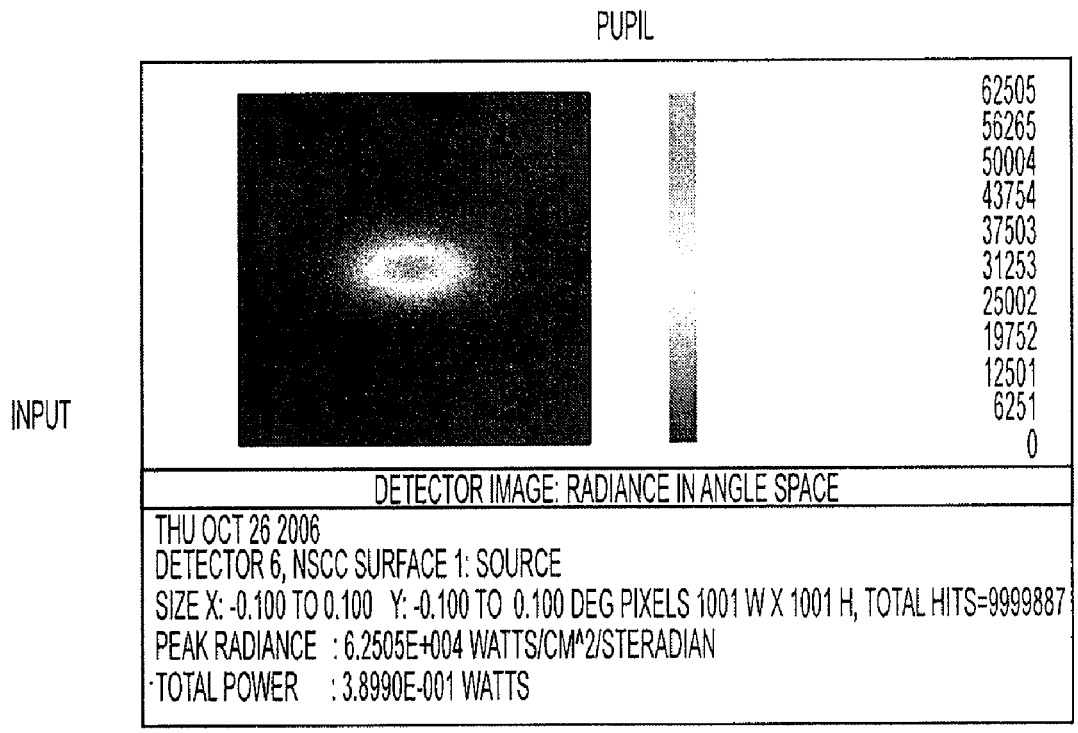
Figure 14B:
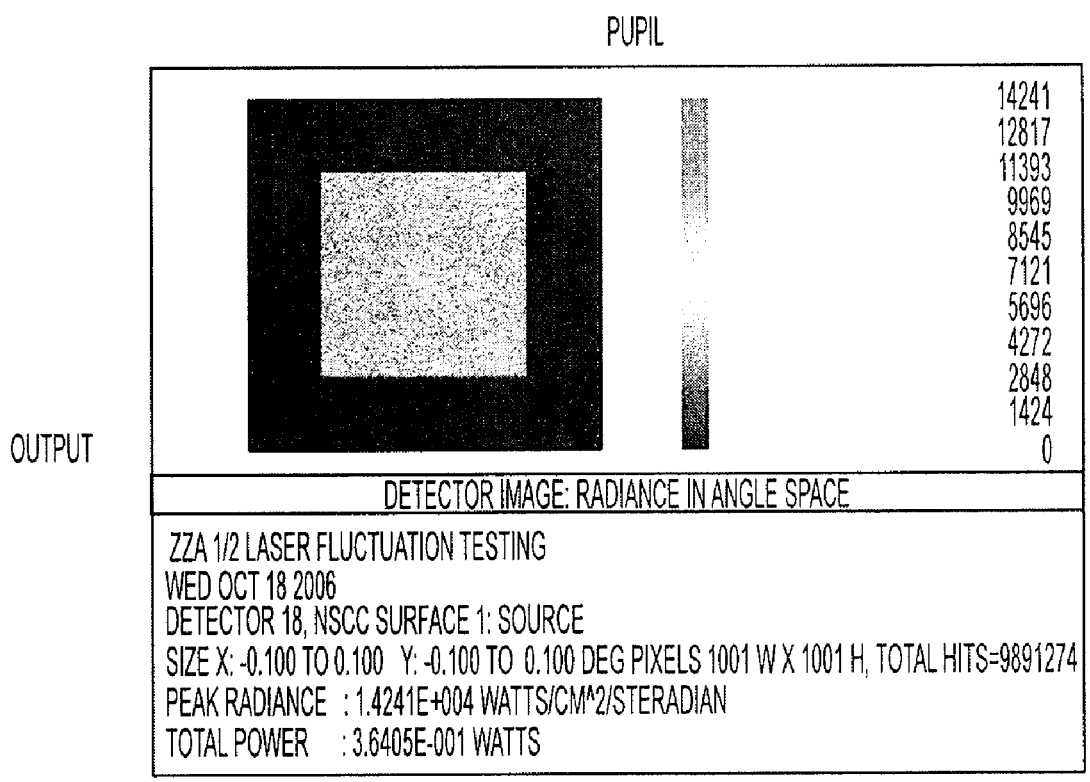

Referring to FIGS. 13A-13B and 14A-14B, respective input and output images of the field in spatial space and that of pupil from the arrangement 700 are schematically illustrated, according to one embodiment of the present invention. The pupil shown in FIG. 14A is an input to the arrangement 700 shown in FIG. 7A. This input is homogenized and symmetrized to provide an output shown in FIG. 14B. For the field being shown as input in FIG. 13A and a corresponding output being shown in FIG. 13B has symmetry such that if the field is to be offset, the output would still turn out to be symmetric having substantially a shape similar to the input where it is not being homogenized.

Consistent with one embodiment of the present invention, a method is provided for controlling the beam of light 305 from the light source 220 associated with the illuminator 300 of a lithography system. The method comprises providing the first beam control module 200 (1) having the first optics 205 (1) in the optical axis 210 for optically isolating the laser pulse 215 from the light source 220 that provides the beam of light 305 to selectively stabilize at least one of the beam pointing error, beam positioning error, beam size error or beam divergence error. The method further comprises using at least one of the first arrangement 310 (1) of the first optics 205 (1) to homogenize selectively at least one of the spatial field or angular information of a given illumination profile for the beam of light and symmetrize other one of the at least one of the spatial field or angular information which is not being homogenized based on the first arrangement 310 (1) of the first optics 205 (1) or the second arrangement 310 (2) of the first optics 205 (1) to homogenize and symmetrize both of the at least one of spatial field and angular information based on the second arrangement 310 (2) of the first optics 205 (1).

For symmetrizing the spatial field and angular information of the given illumination profile for the beam of light 305, the method further calls for selectively stretching the laser pulse 215 from the light source 220. By shaping symmetry of the beam of light 305 with inverting optics of the BSS 605 or a pulse stretcher, the optical apparatus 100 may desensitize the beam of light 305 to fluctuations in at least one of the beam pointing error, beam positioning error, beam size error or beam divergence error. To stabilize at least two of the remaining two or three of the beam pointing error, beam positioning error, beam size error or beam divergence error that are not stabilized by the first beam control module 200 (1), the method calls for receiving the beam of light 305 as input at the second beam control module 200 (2) having the second optics 205 (2) coupled to the first beam control module 200 (1) in the optical axis 210.

In various examples, this single beam of light can be sent directly to a patterning device PD, or can alternatively be directed to the patterning device via a beam splitter (for example as shown in FIGS. 1 and 2) or some other suitable beam transmission means.

In one example, the f-numbers of the beams are chosen to be sufficiently large that the variations in optical path length do not have an appreciable effect on the beam that is incident upon the patterning device PD (e.g., telecentricity, field curvature, etc).

The above description refers to light, light sources and beams of light. It will be appreciated that the light referred to is not limited to light having a visible wavelength, and can include other wavelengths including ultraviolet light or infrared light which are suitable for lithography, as discussed above.

Although specific reference can be made in this text to the use of lithographic apparatus in the manufacture of a specific device (e.g., an integrated circuit or a flat panel display), it should be understood that the lithographic apparatus described herein can have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), etc. Also, for instance in a flat panel display, the present apparatus can be used to assist in the creation of a variety of layers, e.g. a thin film transistor layer and/or a color filter layer.

Although specific reference can have been made above to the use of embodiments of the invention in the context of optical lithography, it will be appreciated that the invention can be used in other applications, for example imprint lithography, where the context allows, and is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention can be practiced otherwise than as described. For example, the invention can take the form of a computer program containing one or more sequences of machine-readable instructions describing a method as disclosed above, or a data storage medium (e.g. semiconductor memory, magnetic or optical disk) having such a computer program stored therein.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. An optical apparatus for controlling fluctuations in one or more of a beam pointing error, a beam positioning error, a beam size error or a beam divergence error of a beam of light in a lithography system, the optical apparatus comprising:

a first beam control module having a first optics in an optical axis for optically isolating a laser pulse from a light source associated with an illuminator to provide the beam of light, the first beam control module configured to selectively stabilize at least one of the beam pointing error, beam positioning error, beam size error or beam divergence error by homogenizing selectively one of spatial field or angular information of a given illumination profile for the beam of light and symmetrizing the other one of the spatial field or angular information, which is not being homogenized, based on a first arrangement of the first optics or homogenizing and symmetrizing both of the spatial field and angular information based on a second arrangement of the first optics.

2. The optical apparatus of claim 1, wherein the optical apparatus further comprises:

a second beam control module having a second optics coupled to the first beam control module in the optical axis to receive the beam of light, the second beam control module configured to stabilize at least two of the remaining two or three of the beam pointing error, beam positioning error, beam size error or beam divergence error that are not stabilized by the first beam control module.

3. The optical apparatus of claim 2, wherein the second optics of the second beam control module further comprises:

a beam symmetry shaper with inverting optics to symmetrize the spatial field and angular information of the given illumination profile for the beam of light.

4. The optical apparatus of claim 3, wherein the first arrangement of the first optics comprises:

first and second homogenizer plates coupled to the beam symmetry shaper for homogenizing selectively one of the spatial field or angular information and symmetrizing the other one of the spatial field or angular information which is not being homogenized.

5. The optical apparatus of claim 2, wherein the first arrangement of the first optics comprises first and second homogenizer plates for homogenizing selectively one of the spatial field or angular information and symmetrizing the other one of the spatial field or angular information which is not being homogenized in a first direction by the first and second homogenizer plates, and the second optics of the second beam control module comprises a third and a fourth homogenizer plates for homogenizing selectively one of the spatial field or angular information and symmetrizing the other one of the spatial field or angular information which is not being homogenized in a second direction orthogonal to the first direction by the third and fourth homogenizer plates.

6. The optical apparatus of claim 2, wherein the second arrangement of the first optics of the first beam control module comprises:
first and second homogenizer plates for homogenizing and symmetrizing both the spatial field and angular information of the given illumination profile for the beam of light in a first direction.

7. The optical apparatus of claim 6, wherein the second optics of the second beam control module further comprises:
third and fourth homogenizer plates coupled to the first and second homogenizer plates for homogenizing and symmetrizing both the spatial field and angular information in a second direction orthogonal to the first direction.

8. The optical apparatus of claim 2, further comprises:
a first waveplate disposed between the first and second beam control modules in the optical axis.

9. The optical apparatus of claim 8, further comprises:
a second waveplate disposed between the second beam control module and an output plane in the optical axis.

10. The optical apparatus of claim 1, wherein the first and second beam control modules enable lithographic processing of a substrate.

11. A method for controlling a beam of light from a light source associated with an illuminator of a lithography system, the method comprising:
providing a first beam control module having a first optics in an optical axis for optically isolating a laser pulse from the light source that provides the beam of light to selectively stabilize at least one of the beam pointing error, beam positioning error, beam size error or beam divergence error; and
using at least one of a first arrangement of the first optics to homogenize selectively one of spatial field or angular information of a given illumination profile for the beam of light and symmetrize the other one of the spatial field or angular information, which is not being homogenized, based on the first arrangement of the first optics or a second arrangement of the first optics to homogenize and symmetrize both of the spatial field and angular information based on the second arrangement of the first optics.

12. The method of claim 11, further comprising:
selectively stretching the laser pulse from the light source for symmetrizing the spatial field and angular information of the given illumination profile for the beam of light.

13. The method of claim 12, wherein selectively stretching the laser pulse from the light source further comprising:
shaping symmetry of the beam of light with inverting optics for desensitizing the beam of light to fluctuations in at least one of the beam pointing error, beam positioning error, beam size error or beam divergence error.

14. The method of claim 11, further comprising:
receiving the beam of light as input at a second beam control module having a second optics coupled to the first beam control module in the optical axis to stabilize at least two of the remaining two or three of the beam pointing error, beam positioning error, beam size error or beam divergence error that are not stabilized by the first beam control module.

15. The method of claim 11, further comprising:
using first and second homogenizer plates for the first arrangement of the first optics to homogenize selectively the one of the spatial field or angular information and symmetrize the other one of the spatial field or angular information which is not being homogenized in a first direction by the first and second homogenizer plates; and
using third and fourth homogenizer plates for the second optics of the second beam control module to homogenize selectively the at least one of the spatial field or angular information and symmetrize the other one of the at least one of the spatial field or angular information which is not being homogenized in a second direction orthogonal to the first direction by the third and fourth homogenizer plates.

16. A lithographic apparatus, comprising:
an illumination system that conditions a beam of light and comprises a beam symmetry shaper with inverting optics coupled to a beam control module having a first and a second homogenizer plates;
an array of individually controllable elements that modulate the beam of light; and
a projection system that projects the modulated beam of the light onto a target portion of a substrate,
wherein the beam symmetry shaper is configured to symmetrize the spatial field and angular information of the given illumination profile for the beam of light,
wherein the beam control module is configured to homogenize selectively one of the spatial field or angular information of a given illumination profile for the beam of light,
wherein the beam control module is configured to symmetrize the other one of the spatial field or angular information, which is not being homogenized, based on a first arrangement of the first optics or homogenize, and
wherein the beam control module is configured to symmetrize both of the spatial field and angular information based on a second arrangement of the first optics.

17. The lithographic apparatus of claim 16, wherein the illumination system forms a plurality of the beams and further comprises:
a pulse stretcher for stretching a laser pulse from a light source associated with an illuminator that provides the beam of light.

18. The lithographic apparatus of claim 17, wherein the beam symmetry shaper further comprises:
a beam splitter that splits the incident beam of light into a plurality of radiation beams;
a first lens and a second lens to image a reflected beam back thereon in an inverted form;
a path compensator; and
a set of mirrors that are arranged with the beam splitter and the first and second lenses to direct individual beams of light onto the substrate through the path compensator.

19. The lithographic apparatus of claim 16, wherein the beam control module uses a first homogenizer plate and a second homogenizer plate to selectively homogenize only a numerical aperture space such that the beam symmetry shaper turns pointing and position shifts into corresponding divergence and width changes.

20. The lithographic apparatus of claim 16, wherein the first arrangement of the first optics and the second arrangement of the first optics each comprise a plurality of rectangular plates.

* * * * *